(12) United States Patent
Fukuoka

(10) Patent No.: US 7,737,721 B2
(45) Date of Patent: Jun. 15, 2010

(54) LATCH CIRCUIT AND SEMICONDUCTOR INTEGRATED CIRCUIT DEVICE THAT HAS IT

(75) Inventor: Kouhei Fukuoka, Osaka (JP)

(73) Assignee: Panasonic Corporation, Osaka (JP)

( * ) Notice: Subject to any disclaimer, the term of this patent is extended or adjusted under 35 U.S.C. 154(b) by 90 days.

(21) Appl. No.: 11/700,121

(22) Filed: Jan. 31, 2007

(65) Prior Publication Data

US 2007/0188159 A1 Aug. 16, 2007

(30) Foreign Application Priority Data

Jan. 31, 2006 (JP) ............................. 2006-022469

(51) Int. Cl.
*H03K 19/173* (2006.01)
*G06F 7/38* (2006.01)
(52) U.S. Cl. .................... 326/38; 327/203; 327/206; 326/113
(58) Field of Classification Search ................. 326/113; 327/200–218, 55, 198
See application file for complete search history.

(56) References Cited

U.S. PATENT DOCUMENTS

| 5,032,744 | A | * | 7/1991 | Wai Yeung Liu | 327/55 |
| 5,391,935 | A | * | 2/1995 | Gersbach et al. | 327/198 |
| 5,463,335 | A | * | 10/1995 | Divakaruni et al. | 327/143 |
| 5,510,732 | A | * | 4/1996 | Sandhu | 326/94 |
| 5,530,377 | A | * | 6/1996 | Walls | 326/30 |
| 5,942,916 | A | * | 8/1999 | Matsbara et al. | 326/83 |
| 5,969,543 | A | * | 10/1999 | Erickson et al. | 326/83 |
| 6,275,088 | B1 | * | 8/2001 | Jain | 327/312 |
| 6,380,781 | B1 | * | 4/2002 | Karnik et al. | 327/215 |
| 7,003,421 | B1 | | 2/2006 | Allen, III et al. | |

FOREIGN PATENT DOCUMENTS

JP 11-145237 5/1999

* cited by examiner

*Primary Examiner*—Vibol Tan
*Assistant Examiner*—Crystal L Hammond
(74) *Attorney, Agent, or Firm*—McDermott Will & Emery LLP

(57) ABSTRACT

A semiconductor integrated circuit comprises: a latch circuit constituted with a drive inverter and a feedback inverter so as to be connected in a cyclic form, wherein at least one of the drive inverter and the feedback inverter comprises a MOS transistor; and
a current source connected to at least one of latch nodes of the latch unit. The magnitude relation of electric current flown in the MOS transistor and electric current flown in the current source is judged based on presence or absence of inversions in data values latched in the latch node.

9 Claims, 22 Drawing Sheets

F I G. 3
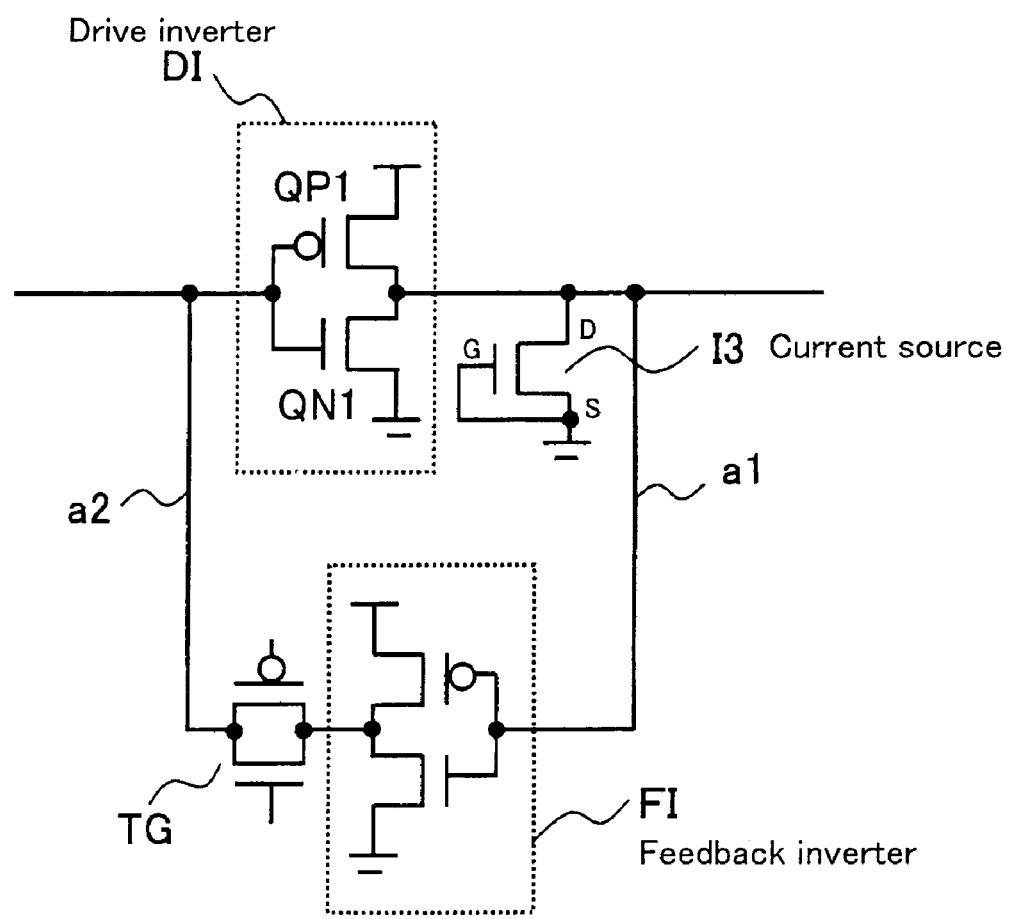

F I G. 4
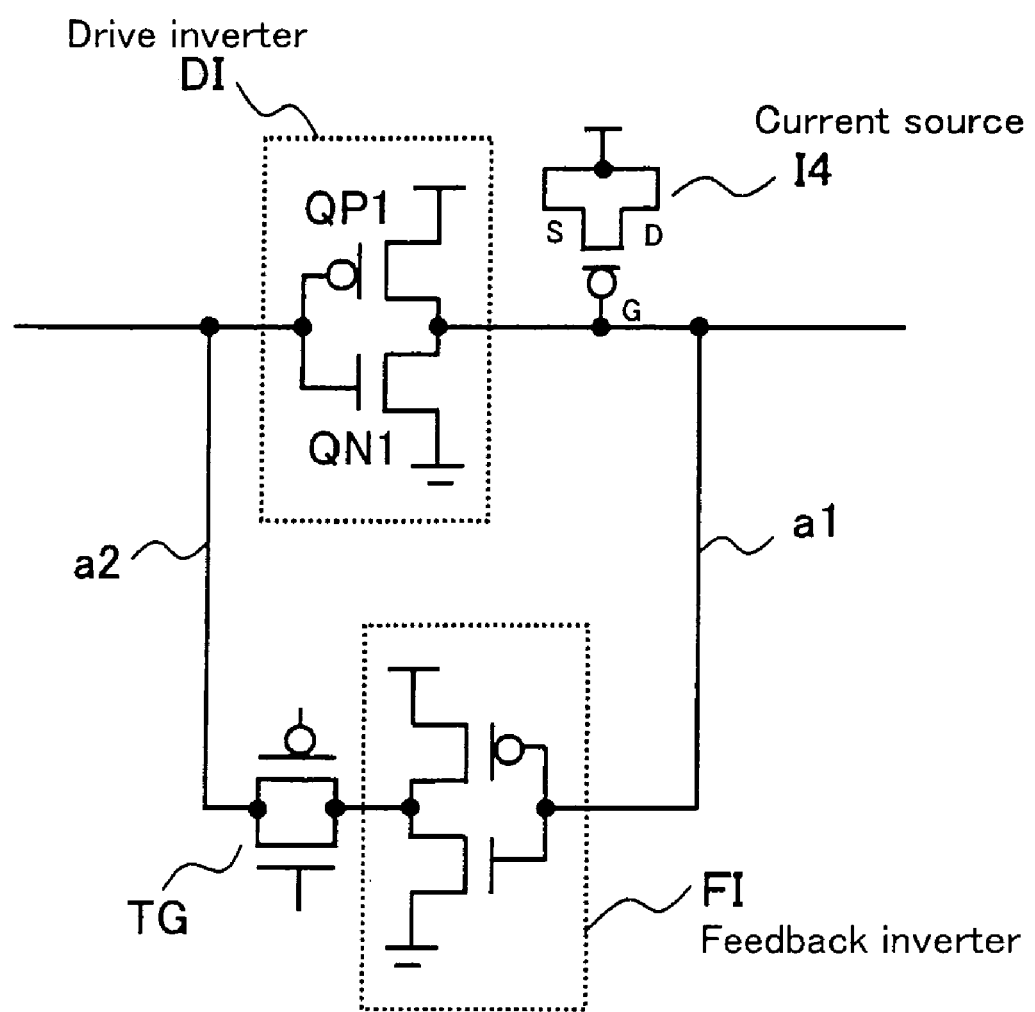

F I G. 5
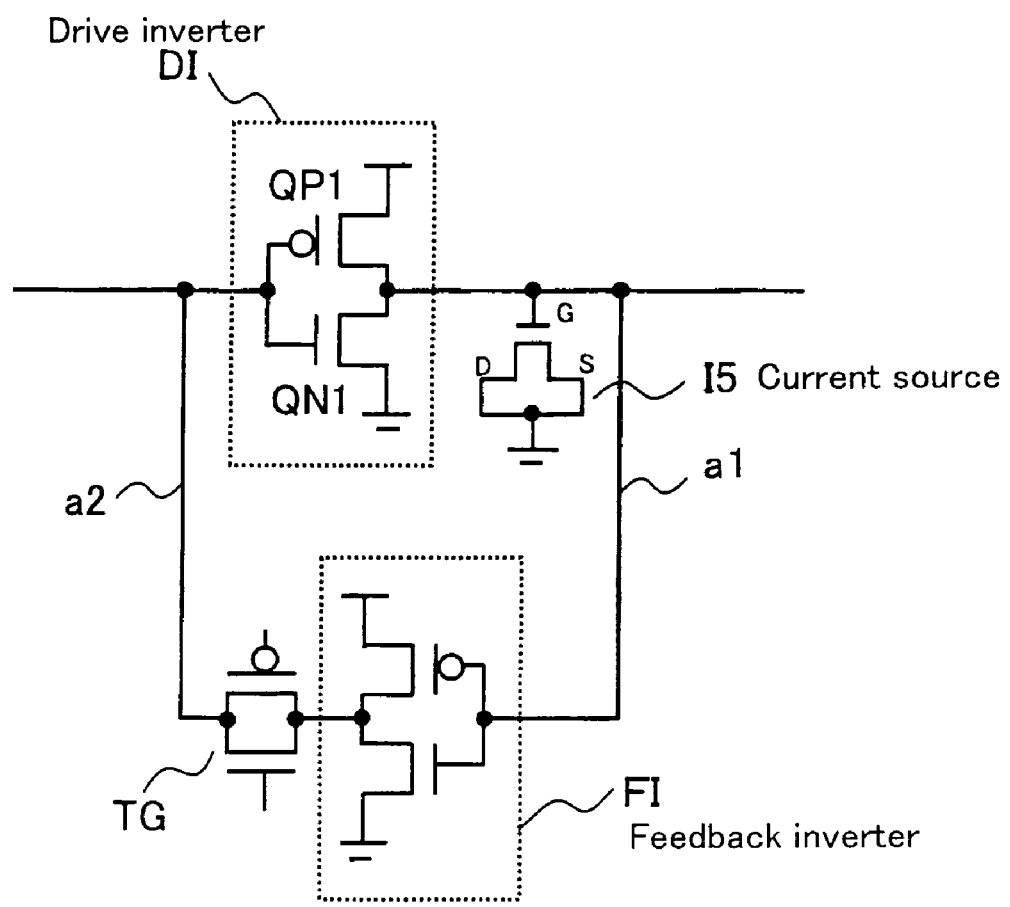

F I G. 7
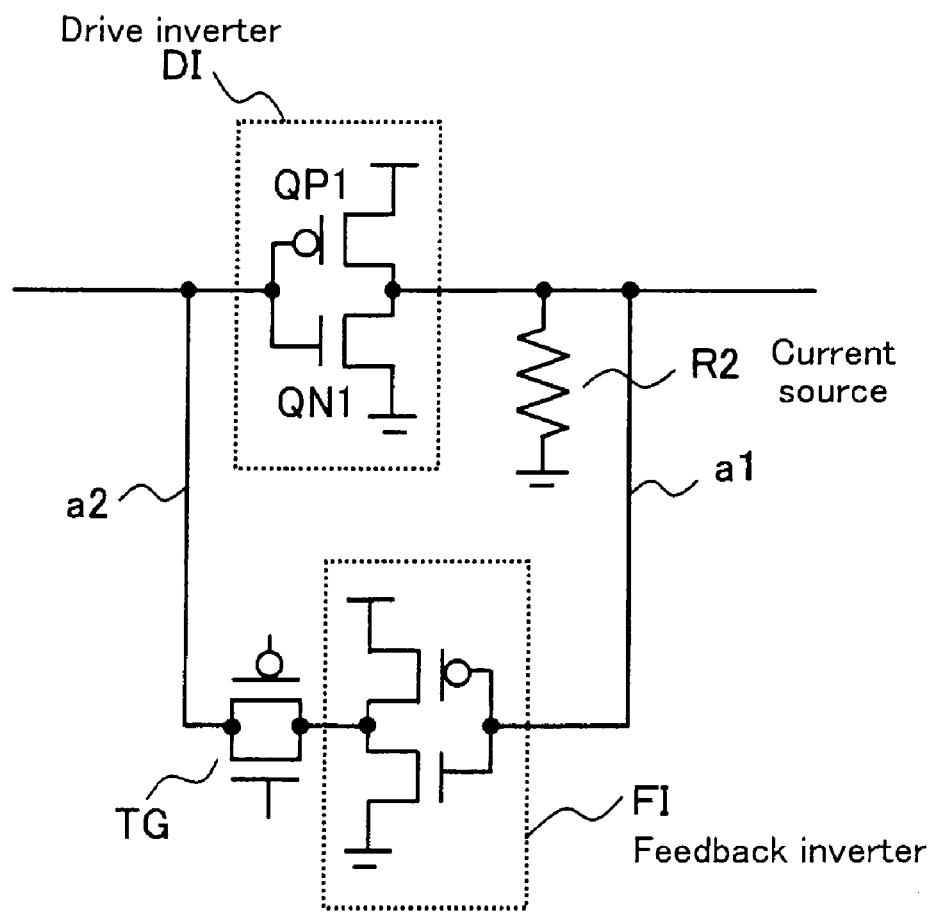

F I G. 8
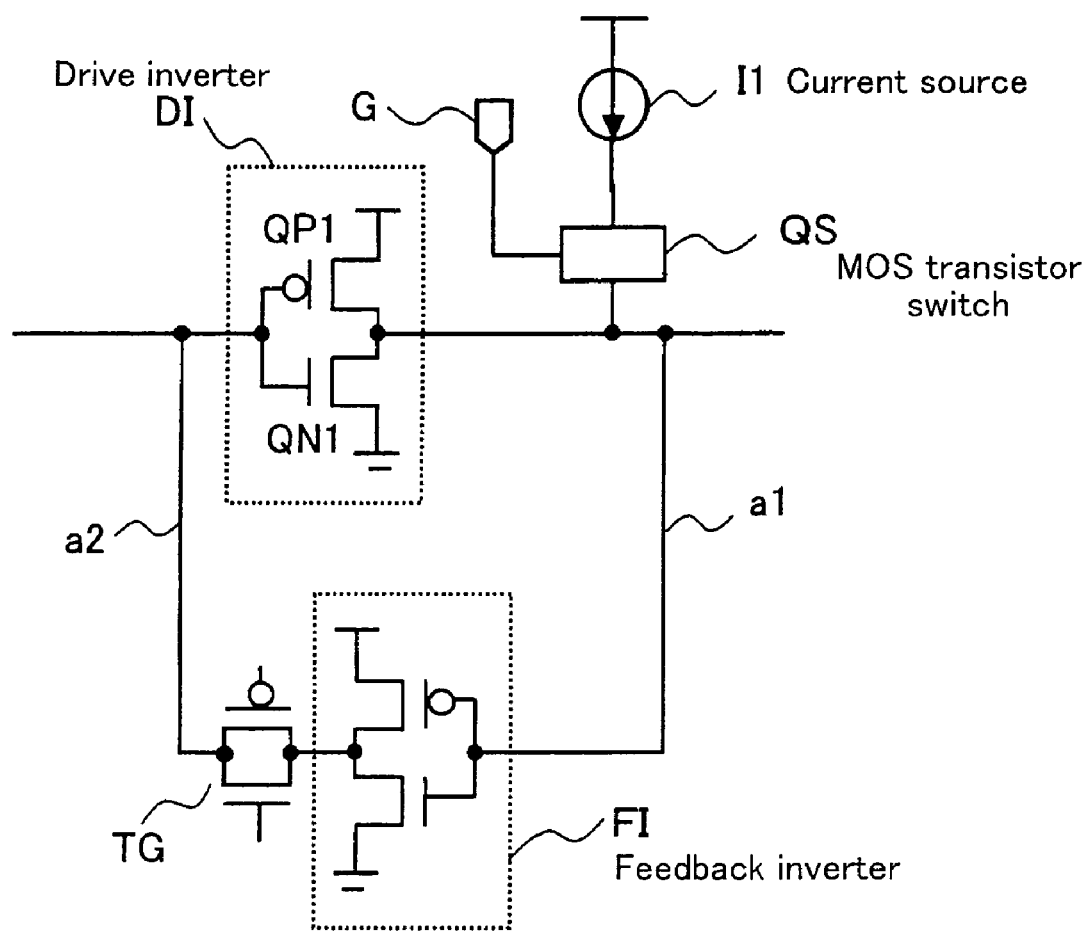

| Voltage | Number of inversions | Finishing state |
|---|---|---|
| V1 | 0~100 | Fast ↑ |
| | 100~1000 | |
| | 1000~9000 | |
| | 9000~9900 | |
| | 9900~10000 | Slow |

| Voltage | Occurrence of inversions | Finishing state |
|---|---|---|
| V5 | non-upset | Slow2 |
| V4 | non-upset | Slow1 |
| V3 | non-upset | Typical |
| V2 | non-upset | Fast1 |
| V1 | upset | Fast2 |

F I G. 1 7
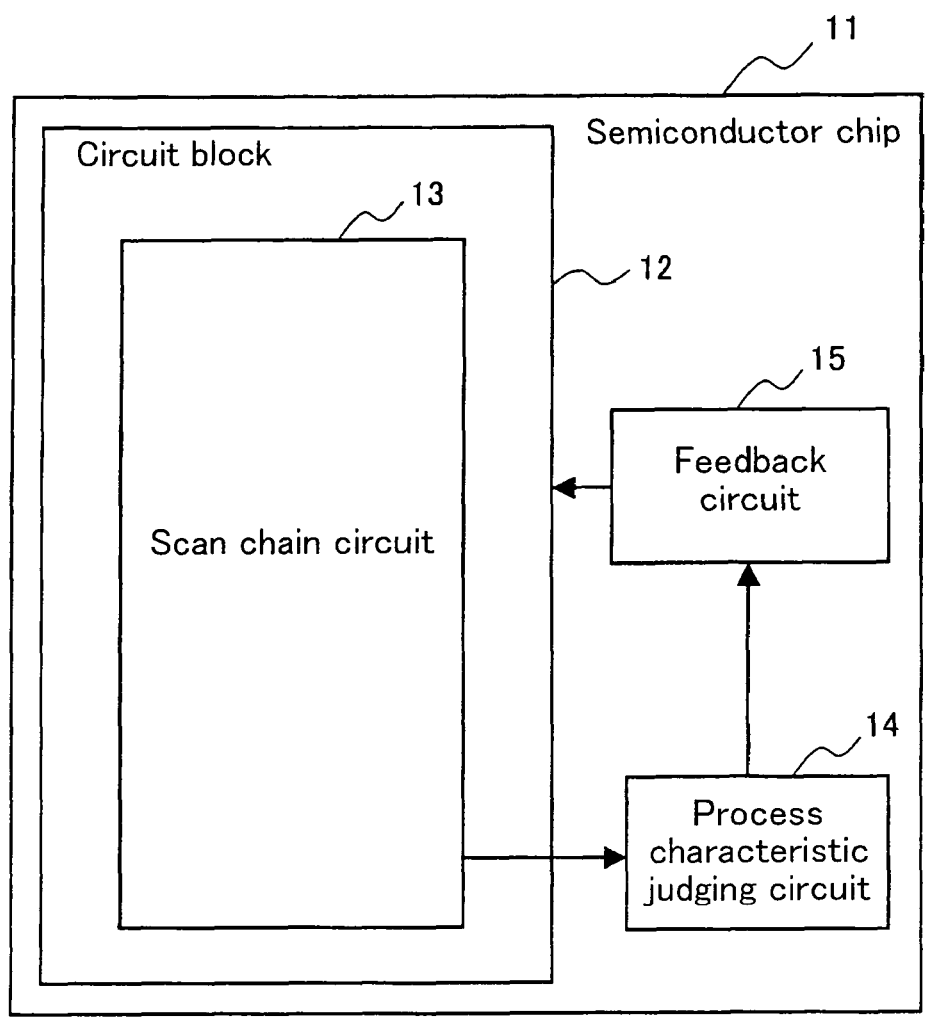

F I G. 2 1
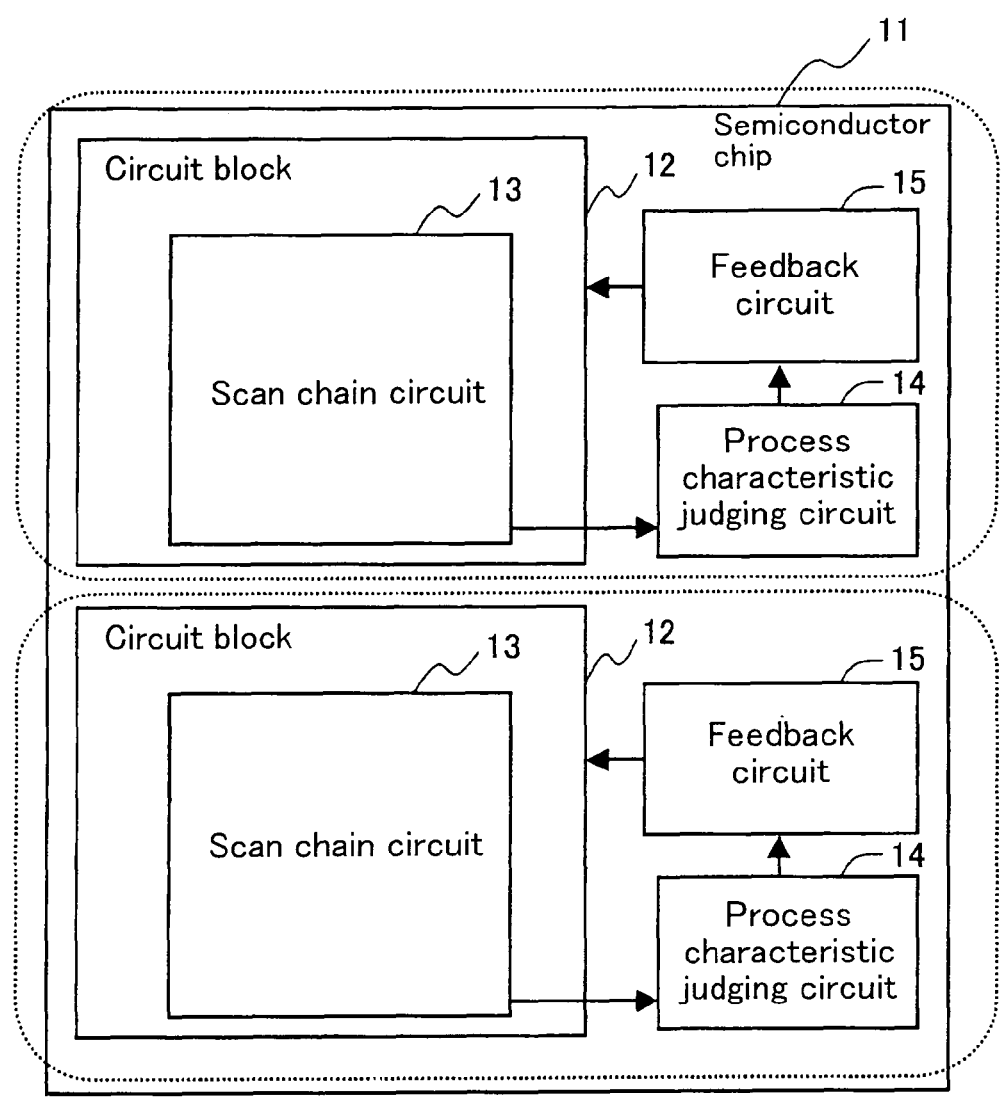

LATCH CIRCUIT AND SEMICONDUCTOR INTEGRATED CIRCUIT DEVICE THAT HAS IT

BACKGROUND OF THE INVENTION

1. Field of the Invention

The present invention relates to a latch circuit having a function of monitoring process variations of semiconductor chips and to a scan chain circuit that comprises the latch circuit. Furthermore, the present invention relates to a semiconductor integrated circuit device that comprises the scan chain circuit, and a process variation judging method of the same.

2. Description of the Related Art

Recently, process variation of semiconductor chips has been increased in accordance with advanced micropattern of semiconductor integrated circuit devices. As a result, process variations tend to go out of the process control and deteriorate the yield of the products. In order to improve the yield, it is important to monitor the process variations, analyze the information, and feed it back to the manufacturing steps.

Consequently, there is a conventional technique in which an exclusive characteristic evaluation element is mounted on a semiconductor wafer, and process variation is measured with a measuring device provided outside thereof. However, as the characteristic evaluation element is formed on a scribe lane (cutting line), the process variation cannot be measured after packaging. In addition, a prober is required and a large number of measuring steps are required as well.

As a measure taken for the problems described above, conventionally, there is a first proposal for a process variation judging circuit that is capable of judging process variations automatically at a high speed, as disclosed in Japanese Published Patent Literature (Unexamined Patent Publication H11-145237). In this proposal, the process variation judging circuit is mounted within a semiconductor chip, and the process variation of the chip can be measured by outputting information of the process variation of each semiconductor chip through being converted to binary signals.

Further, conventionally, there is a second proposal for a substrate bias control circuit that reduces the process variations. In the second proposal, a device for monitoring the process variation is formed within a semiconductor chip, and a substrate bias is applied to a substrate terminal of a MOS transistor of the semiconductor chip to improve the characteristic of the device. Herewith, the process variation of the MOS transistor can be reduced.

However, it becomes a factor for increasing the size (area) of the semiconductor chip to mount the process variation judging circuit to each semiconductor chip as in the first proposal. Furthermore, the second proposal cannot deal with such a fault that it does not work at a desired operating frequency due to the process variation within the chip, since it has no device improving unit such as a substrate bias control circuit. However, it is more difficult to mount a plurality of process variation judging circuits within a semiconductor chip in terms of the area as described above. Therefore, it is not possible in the first proposal to deal with a plurality of process variations.

In the structure of the second proposal, the monitor circuit monitors the process characteristic only at a certain point within the chip. Therefore, when that certain point does not reflect the process characteristic within the chip, the effect of correcting the variation is diminished.

SUMMARY OF THE INVENTION

The main object of the present invention therefore is to achieve measurement of process variation within a chip easily with a small area, and to enable monitoring of the process variation within the chip after packaging.

In order to solve the aforementioned problems, a latch circuit of the present invention comprises: a latch unit constituted with a drive inverter and a feedback inverter being connected in a cyclic form, wherein at least either the drive inverter or the feedback inverter comprises a MOS transistor; and a current source connected at least to one of latch nodes of the latch unit, wherein a magnitude relation between electric current flown in the MOS transistor and electric current flown in the current source is judged based on presence or absence of inversions in data values latched in the latch node.

Connecting the drive inverter and the feedback inverter in a cyclic form means that the input terminal of the feedback inverter is connected to the output terminal of the drive inverter, and the input terminal of the drive inverter is connected to the output terminal of the feedback inverter.

The supply voltage, at which the characteristic curve of the current value of the design value (Typical) flown between the drain and source of the MOS transistor (the target of judgment) intersects with the characteristic curve of the current value of the current source, is considered as the judging reference voltage. The supply voltage is controlled to be close to the judging reference voltage while data is being latched. In between the case where the MOS transistor as the target of judgment is fabricated to have the characteristic curve of the current values I(Typical)-I(Fast) and the case where it is fabricated to have the characteristic curve of the current value I(Slow), the inversion phenomena of data values latched in the latch node become different. That is, when the supply voltage is brought closer to the judging reference supply voltage, the data value latched in the latch node is not inverted and remained in that state, or it is inverted. Thus, by measuring the presence or absence of data inversion, it is possible to judge whether the MOS transistor as the target of judgment is fabricated in a state of having the characteristic curve of the current values I(Typical)-I(Fast) or fabricated in a state of having the characteristic curve of the current value I(Slow). In other words, the presence or absence of inversions in the data values latched in the latch circuit reflects the process variations of the target MOS transistor in the latch circuit. It is noted that the latch circuit is also capable of functioning as the regular latch unit, and it is different from the process variation judging circuit of the conventional technique in terms of the technical characteristic.

As the latch circuit of the present invention is provided with not only a function of judging process characteristics but also a function of latching data though it has a simple circuit structure, the structure for monitoring the process variation can be achieved easily with a small area. By employing this latch circuit to the scan chain circuit, information regarding the process variation can be efficiently collected. Further, by applying the information regarding the process variation to the substrate control technique, the power supply control technique, and PCM (Process Control Monitor), yield of the semiconductor chips can be improved.

In the above-described structure, there is such an embodiment that the current source comprises a PMOS transistor, wherein a drain terminal of the PMOS transistor is connected to the latch node, a source terminal of the PMOS transistor is connected to a high-potential side power supply, and a gate terminal of the PMOS transistor is connected to the source terminal. In this case, the MOS transistor as the target of judgment is the NMOS transistor of the inverter.

For example, in the case where the PMOS transistor as the current source is connected to the output node of the drive inverter and the OFF-current capacity of the PMOS transistor as the current source is the design value (Typical) of the ON-current of the NMOS transistor that constitutes the drive inverter, the NMOS transistor constituting the drive inverter comes to have the current capacity of less than the design value when the data value latched in the output node of the drive inverter is inverted to be High. This means that the process of the NMOS transistor is fabricated as "Slow". Further, it is preferable to layout the PMOS transistor as the current source to have a long gate length, so that the influence of the process variation can be reduced. Furthermore, it is desirable to perform evaluation at the supply voltage at which the ON-current of the NMOS transistor that constitutes the drive inverter and the current value of the PMOS transistor as the current source become the same values in the TYP process.

Further, in the above-described structure, there is such an embodiment that the latch circuit further comprises a low-potential side power supply, wherein the current source comprises an NMOS transistor wherein a drain terminal of the NMOS transistor is connected to the latch node, a source terminal of the NMOS transistor is connected to the low-potential side power supply, and a gate terminal of the NMOS transistor is connected to the source terminal. In this case, the MOS transistor as the target of judgment is the PMOS transistor of the inverter. Herewith, the layout size of the semiconductor integrated circuit device can be reduced by using the NMOS transistor for the current source.

Furthermore, in the above-described structure, there is such an embodiment that the latch circuit further comprises a high-potential side power supply wherein the current source comprises a PMOS transistor, wherein a drain terminal and a source terminal of the PMOS transistor are connected to the high-potential side power supply, and a gate terminal of the PMOS transistor is connected to the latch node. In this case, the MOS transistor as the target of judgment is the NMOS transistor of the inverter. In this structure, there is no temperature dependency because the current source utilizes the gate leak current. Therefore, it is possible to monitor the temperature variation and the process variation of the NMOS transistor as the target of judgment, and thereby enable the more accurate judgment of the process.

Moreover, in the above-described structure, there is such an embodiment that the latch circuit further comprises a low-potential side power supply wherein the current source comprises an NMOS transistor, wherein a drain terminal and a source terminal of the NMOS transistor are connected to the low-potential side power supply, and a gate terminal of the NMOS transistor is connected to the latch node. In this case, the MOS transistor as the target of judgment is the PMOS transistor of the inverter. In this structure, the more accurate judgment of process can be achieved since the current source has no temperature dependency. In addition, layout size of the semiconductor integrated circuit device can be reduced through using the NMOS transistor for the current source.

Further, in the above-described structure, there is such an embodiment that the latch circuit further comprises a high-potential side power supply wherein the current source comprises a resistance element, wherein one end of the resistance element is connected to the high-potential side power supply, and the other end of the resistance element is connected to the latch node. Herewith, the layout of the current source can be simplified.

Furthermore, in the above-described structure, there is such an embodiment that the latch circuit further comprises a low-potential side power supply wherein the current source comprises a resistance element, wherein one end of the resistance element is connected to the low-potential side power supply, and the other end of the resistance element is connected to the latch node. Herewith, the layout of the current source is facilitated as in the above-described case.

Moreover, in the above-described structure, there is such an embodiment that the latch circuit comprises a MOS transistor switch provided between the current source and the latch node wherein a drain terminal of the MOS transistor switch is connected to the latch node, a source terminal of the MOS transistor switch is connected to the current source, and a gate terminal of the MOS transistor switch is a controllable terminal. Herewith, the electric current flown from the current source to the latch node can be controlled with the MOS transistor switch. The MOS transistor switch may be set OFF to decrease influence of the operation speed in operating the latch circuit as the regular latch unit, and the MOS transistor switch may be set ON in judging the process variation. This MOS transistor switch can be constituted with a transfer gate, a PMOS transistor or an NMOS transistor. In the actual structure, one of those transistors is selected in consideration of the leak current and the layout size of the switch.

Further, in the above-described structure, there is such an embodiment that the current source is eliminated, at least one of the drive inverter and the feedback inverter comprises a plurality of MOS transistors being stacked vertically; and process characteristics of the MOS transistors are judged based on presence or absence of inversions in the data values latched in the latch node of the latch unit.

For example, the larger the number of vertically stacked PMOS transistors is, the smaller the ON-current of the PMOS transistor becomes. Thus, the voltage at which the ON-current becomes the same value as that of the OFF-current of the NMOS transistor can be increased. This enables the more accurate process judgment to be achieved.

Furthermore, in the above-described structure, there is such an embodiment that the current source is eliminated, at least one of the drive inverter and the feedback inverter comprises an NMOS transistor and a PMOS transistor having different gate length from each other; and process characteristics of the NMOS transistor and the PMOS transistor are judged based on presence or absence of inversions in the data values latched in the latch node of the latch unit.

For example, by extending the gate length of the PMOS transistor, the characteristic curve of the ON-current, Ion_p (Typical), of the PMOS transistor can intersect with the characteristic curve of the OFF-current, Ioff_n, of the NMOS transistor. By performing measurement using the voltage at this intersection as the judging reference voltage V1, the process variation can be measured based on the presence or absence of inversions in the data values latched in the latch unit. This enables reduction of variations in the ON-current of the PMOS transistor by extending the gate length of the PMOS transistor, and the process variations of the NMOS transistor can be monitored. In this case, it is desirable to extend the gate lengths of the NMOS transistor and the PMOS transistor so as not to be influenced by the process variation.

A scan chain circuit of the present invention comprises a plurality of connected scan flip-flop circuits, wherein: each of the scan flip-flop circuits comprises a master latch circuit and a slave latch circuit; and at least one of the master latch circuit and the slave circuit included in at least one of the scan flip-flop circuits is constituted with the latch circuit of the present invention.

Herewith, the result of process characteristic judgment obtained by the latch circuit can be outputted by the scan chain circuit, so that the result of process variations can be easily monitored.

Further, a scan chain circuit of the present invention comprises a plurality of connected scan flip-flop circuits, wherein each of the scan flip-flop circuits has a master latch circuit, a slave latch circuit, the latch circuit of the present invention, and a multiplexer circuit that outputs a plurality of input signals in a switchover manner, wherein in at least one of the scan flip-flop circuits, an output terminal of the master circuit is connected to one of input terminals of the multiplexer circuit, an output terminal of the latch circuit is connected to the other input terminal of the multiplexer circuit, and an output terminal of the multiplexer circuit is connected to an input terminal of the slave latch circuit.

Herewith, it is possible to switch the regular scan mode and the process variation monitor mode. According to the switching of the modes, it becomes unnecessary to change the layout of the scan flip-flop circuit. In addition, the latch circuit can be arranged independently, so that the influence to delay the scan flip-flop circuit can be suppressed.

Furthermore, a scan chain circuit of the present invention comprises a plurality of connected scan flip-flop circuits, wherein each of the scan flip-flop circuits has a master latch circuit, a slave latch circuit, the latch circuit of the present invention, and a multiplexer circuit that outputs a plurality of input signals in a switchover manner, wherein in at least one of the scan flip-flop circuits, an output terminal of the master circuit is connected to an input terminal of the slave latch circuit, an output terminal of the slave latch circuit is connected to one of input terminals of the multiplexer circuit, an output terminal of the latch circuit of the present invention is connected to the other input terminal of the multiplexer circuit, and an output terminal of the multiplexer circuit constitutes an output terminal of the scan flip-flop circuit.

Herewith, it is possible to switch the regular scan mode and the process variation monitor mode. According to the switching of the modes, the latch circuit can be arranged independently, so that the influence to delay of the scan flip-flop circuit can be suppressed.

Moreover, a scan chain circuit of the present invention comprises a scan flip-flop circuit group arranged in parallel, the latch circuit of the present invention, and a multiplexer circuit that outputs a plurality of input signals in a switchover manner, wherein: an output terminal of the scan flip-flop circuit constituting the scan flip-flop circuit group is connected to one of input terminals of the multiplexer circuit, an output terminal of the latch circuit is connected to the other input terminal of the multiplexer circuit and an output terminal of the multiplexer circuit is connected to a scan-in terminal of scan flip-flop circuit arranged in a next-stage of the scan flip-flop circuits.

In this structure, as the latch circuit exists outside the scan flip-flop circuit, it is unnecessary to design an newly structured cell as the scan flip-flop circuit, and the versatility of the layout of the latch circuit is increased.

In a method for judging process variation of a semiconductor integrated circuit device to which the scan chain circuit is mounted using the scan chain circuit according to the invention, wherein a voltage supplied to the latch circuit of the scan chain circuit is taken as a judging reference voltage, and then the process variation is judged by counting and totalizing inversion number of data that is latched in the latch circuit.

It is desirable to obtain the data values latched in the latch node as many as possible in order to improve the accuracy of the judgment results of the process variations. In this case, it requires only measurement under one condition of supply voltage per reference supply voltage, so that the time for measurement can be shortened.

Further, it is a process variation judging method of a semiconductor integrated circuit device to which the scan chain circuit is mounted using the scan chain circuit according to the invention, wherein a voltage supplied to the latch circuit of the scan chain circuit is taken as a judging reference voltage, and a plurality of different judging reference voltages are supplied to the latch circuit.

Herewith, it is possible to measure the extent of the process variations in each of the MOS transistors through obtaining the data values latched in the latch node as many as possible in order to improve the accuracy of the judgment results of the process variations.

A semiconductor integrated circuit device of the present invention comprises: a circuit block including the scan chain circuit of the present invention; a process characteristic judging circuit for judging process characteristics based on data values latched in the latch circuit of the scan chain circuit; and a feedback circuit for adjusting characteristic of a device that constitutes the circuit block based on a result of judgment obtained by the process characteristic judging circuit.

Herewith, it is possible to improve the characteristic of the device that constitutes the circuit block based on the information regarding the process variation.

Further, a semiconductor integrated circuit device of the present invention comprises a circuit block including the scan chain circuit of the present invention, a process characteristic judging circuit, and a feedback circuit, wherein a plurality of the circuit blocks are provided so as to be connected to each other; the process characteristic judging circuit judges process characteristics based on data values latched in latch circuits of the plurality of circuit blocks; and a plurality of the feedback circuits are provided corresponding to each of the circuit blocks so as to adjust characteristics of devices that constitute each of the circuit blocks based on a result of judgment obtained by the process characteristic judging circuit.

According to this structure, a single process characteristic judging circuit is used in common for a plurality of circuit blocks and a plurality of feedback circuits. Therefore, the number of mounted process characteristic judging circuits can be reduced, and thereby it allows reduction of the size of the semiconductor chip.

In the above-described structure, there is such an embodiment that the process characteristic judging circuit is arranged outside a semiconductor chip which includes the scan chain circuit. This contributes to reduce the size of the semiconductor chip.

Furthermore, a semiconductor integrated circuit device of the present invention comprises: a circuit block including the scan chain circuit of the present invention; and a storage device arranged outside a semiconductor chip that includes the circuit block, which stores data values latched in the latch circuit of the scan chain circuit.

Herewith, the data values latched in the latch circuit can be utilized to improve the semiconductor manufacture process as a result of monitoring the process. Further, the binary signal is the inherent information of the chip, so that it can also be utilized as an ID of the chip.

In the above-described structure, there is such an embodiment that a plurality of the above-described semiconductor integrated circuit devices are provided within the same semiconductor chip. According to this structure, it is possible to feed back the results of process variations to the plurality of circuit blocks.

In the above-described structure, there is such an embodiment that the feedback circuit is a supply voltage generating circuit for generating a supply voltage of the circuit block. According to this, for example, when it is judged that the electric current of the MOS transistor of the latch circuit that constitutes the semiconductor integrated circuit device is larger than the design value (Typical) in comparison of them, the supply voltage of the circuit block can be dropped and thereby it contributes to keep the low electricity.

Furthermore, in the above-described structure, there is such an embodiment that the feedback circuit is a substrate voltage generating circuit capable of controlling a substrate voltage of a MOS transistor provided in the circuit block. According to this structure, for example, when it is judged that the electric current of the MOS transistor of the latch circuit that constitutes the semiconductor integrated circuit device is larger than the design value (Typical), it is possible to reduce the electric current capacity of the circuit block by applying a negative bias to the substrate of the circuit block capable of controlling the substrate, which includes the semiconductor integrated circuit device. This contributes to keep the low electricity.

According to the latch circuit of the present invention, it can achieve monitoring of the process variations easily with a small area. By applying the latch circuit to the scan chain circuit, information regarding the process variations can be collected efficiently. By feeding back the information regarding the process variations to the manufacture steps, the supply voltage, and the substrate bias, the yield of the semiconductor chips can be improved.

The latch circuit of the present invention is capable of achieving monitoring of the process variations easily with a small area, and the information regarding the process variations can be collected efficiently by applying it to the scan chain circuit. Therefore, the latch circuit of the present invention is effective for improving the yield of the semiconductor chips, furthermore reducing the manufacture cost, etc.

BRIEF DESCRIPTION OF THE DRAWINGS

Other objects of the present invention will become clear from the following description of the preferred embodiments and the appended claims. Those skilled in the art will appreciate that there are many other advantages of the present invention by embodying the present invention.

FIG. 3 is a circuit diagram showing the structure of a latch circuit according to Modification Example 2;

FIG. 4 is a circuit diagram showing the structure of a latch circuit according to Modification Example 3;

FIG. 5 is a circuit diagram showing the structure of a latch circuit according to Modification Example 4;

FIG. 7 is a circuit diagram showing the structure of a latch circuit according to Modification Example 6;

FIG. 8 is a circuit diagram showing the structure of a latch circuit according to Modification Example 7;

FIG. 17 is a first constitution diagram of a semiconductor chip according to the embodiments of the present invention;

FIG. 21 is a fifth constitution diagram of the semiconductor chip according to the embodiments of the present invention;

DETAILED DESCRIPTION OF THE PREFERRED EMBODIMENTS

Hereinafter, preferred embodiments of the present invention will be described referring to the accompanying drawings.

(Structure of Latch Circuit)

Figure 1A:
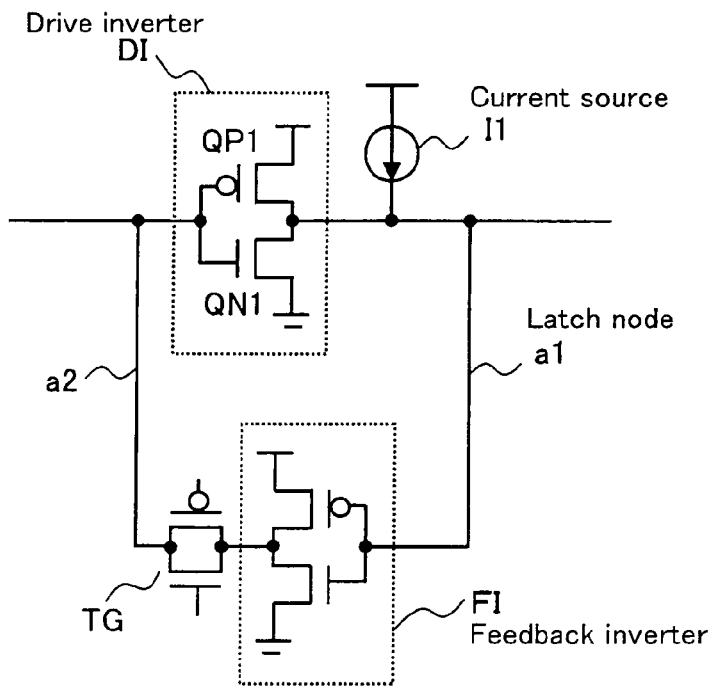
FIG. 1A is a circuit diagram showing an example of the fundamental structure of a latch circuit according to embodiments of the present invention.

FIG. 1A is a circuit diagram showing an example of the fundamental structure of a latch circuit according to embodiments of the present invention. This latch circuit has a function of a latch unit (regular operation) and a function of a process variation monitoring circuit. Drive inverter DI of the latch unit is constituted with a PMOS transistor QP1 and an NMOS transistor QN1. A MOSFET whose gate is marked with a circle is a P-channel type and a MOSFET whose gate is not marked with a circle is an N-channel type. FI is a feedback inverter in the latch unit. TG is a transfer gate that turns ON/OFF by a clock signal. I1 is a current source. The current source I1 is connected to a latch node that connects the output end of the drive inverter DI and the input end of the feedback inverter FI. That is, the latch circuit comprises the latch unit that is constituted with the drive inverter DI and the feedback inverter FI connected in a cyclic form, and the current source I1 connected to a latch node a1 of the latch unit.

The latch circuit comprises circuit elements other than the latch unit (drive inverter DI, the feedback inverted FI, and the transfer gate TG). However, explanations of the circuit elements other than the latch unit will be omitted in the following description. Further, the following explanations will be provided assuming that the transfer gate is ON, and data is latched in the latch unit.

Figure 1B:
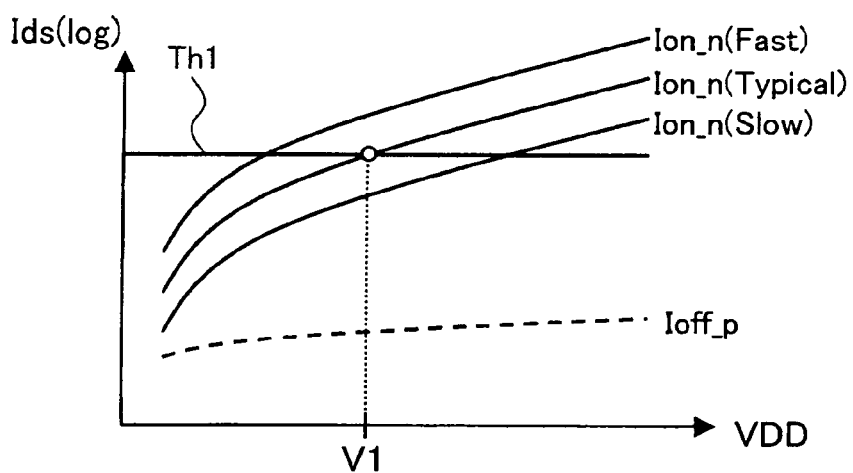
FIG. 1B is a characteristic diagram showing dependency to supply voltage of the electric current of a drive inverter.

Next, description will be given to an operation for counting the process variations by the latch circuit in the structure of FIG. 1A. The latch circuit is so structured that the electric current from the current source I1 flows into the latch node a1. Thus, data is latched in the latch circuit so that the latch node a1 becomes Low and a latch node a2 becomes High. FIG. 1B shows the voltage dependency of the electric current in the electric power source I1, the PMOS transistor QP1, and the NMOS transistor QN1 in a state where the data is latched as described above.

Th1 is a design value of the current value in the current source I1. Ion_n(typical) is a characteristic curve of the current value of the design value in the NMOS transistor QN1. Ion_n(Fast) is a characteristic curve of the current value when the threshold voltage is set lower than the standard to enable a high-speed operation. Ion_n(Slow) is a characteristic curve of the current value when the threshold voltage is set higher than the standard to be in a slow operation. Ioff_p is an OFF-current characteristic curve in the PMOS transistor QP1. The supply voltage at which the characteristic curve of Ion_n(typical) crosses with the design value Th1 of the current source I1, is considered as a judging reference voltage V1.

First, description will be given assuming a case where the supply voltage is dropped to the judging reference voltage V1 while the data is being latched. In this case, when the NMOS transistor QN1 is fabricated to be in the state of the current value as in the characteristic curve of Ion_n(Fast), the potential of the latch node a1 does not boost up and keeps Low since the characteristic curve of the current value, Ion_n(Fast), is over the current value Th1 of the current source I1. Meanwhile, when the NMOS transistor QN1 is fabricated to be in the state of the current value as in the characteristic curve of Ion_n(Slow), the potential of the latch node a1 boosts up and inverts from Low to High, since the characteristic curve of the current value, Ion_n(Slow) is below the current value Th1 of the current source I1.

Here, the NMOS transistor QN1 that constitutes the drive inverter DI is the target of judgment. Therefore, the magnitude relation between the current value flown in the NMOS transistor QN1 as the judgment target and the current value Th1 flown in the current source I1 is judged based on presence or absence of inversions in the data value that is latched in the latch node a1.

Like this, the process variation of the MOS transistor is measured in this embodiment by utilizing the change in the data latch state caused by the process variation. Specifically, the current value flown in the current source I1 and the current value flown in the MOS transistor (NMOS transistor QN1 in this case) are compared as the direct current and then the process variation of the MOS transistor is measured.

In the circuit structure shown in FIG. 1A, the process variation of the NMOS transistor QN1 is monitored. A process variation is also generated in the feedback inverter F1. However, the fluctuation of the potential in the latch node a1 caused by the process variation of the NMOS transistor QN1 is sufficiently large compared to the fluctuation of the potential due to the process variation of the feedback inverter FI. Thus, the process variation in the feedback inverter FI does not influence the fluctuation of the potential in the latch node a1, unless the ratio pf the ON-current to the OFF-current of the MOS transistor of the feedback inverter F1 is not a specific value.

For achieving measurement with a higher accuracy, the gate length or gate width of the MOS transistor of the feedback inverter FI may be increased. Further, the current source I1 may be designed so that the current value of the OFF-current, Ioff_p, of the PMOS transistor QP1 in the drive inverter DI becomes sufficiently smaller than the current value Th1 of the current source I1. By doing this, the influence of the process variation in the PMOS transistor QP1 can be ignored.

Like this, by the use of the latch circuit having the circuit structure shown in FIG. 1A, the process variation can be measured easily with a small area. In the circuit structure shown in FIG. 1A, though the current source I1 is connected to the latch node a1, the same measurement can be achieved by connecting the current source I1 to the latch node a2. This is the same in the circuit structures shown in FIG. 2-FIG. 8, which will be described below.

Modification Example 1 of Latch Circuit

Figure 2A:
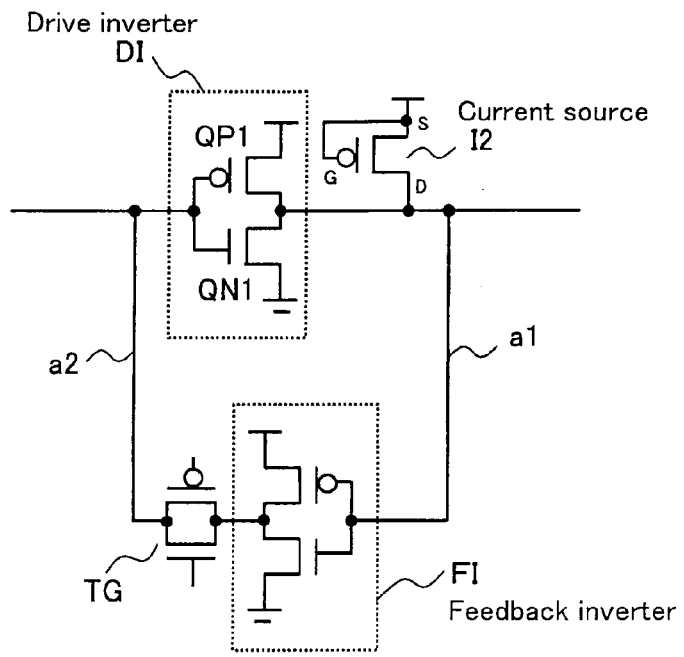
FIG. 2A is a circuit diagram showing the structure of a latch circuit according to Modification Example 1.

In the circuit structure shown in FIG. 2A, a current source I2 that is constituted with a PMOS transistor is provided in place of the current source I1 of FIG. 1. A drain terminal of the current source (PMOS transistor) 12 is connected to the latch node a1, and a source terminal and a gate terminal are connected to a high-potential side power supply. Thus, the current source (PMOS transistor) I2 becomes OFF, and the dependency to current and voltage of the current source I2 is decreased compared to the ON-current of the NMOS transistor QN1 of the drive inverter DI. The judgment target in this case is the NMOS transistor QN1. Other structures are the same as those of the first embodiment (FIG. 1A), so the same reference numerals are applied to the same components and the descriptions thereof are omitted.

Figure 2B:
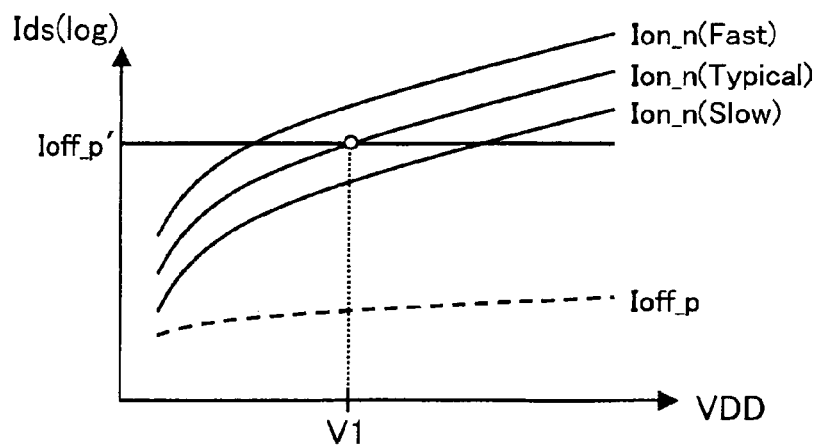
FIG. 2B is a characteristic diagram showing dependency to supply voltage of the electric current of a drive inverter.

In FIG. 2B, Ioff_p' is the OFF-current of the current source (PMOS transistor) I2. The use of this current characteristic enables the process variation to be monitored, so that the process variation of the NMOS transistor QN1 can be monitored. The higher the judging reference voltage V1 is, the larger the current difference due to the process variation at that voltage becomes. Thus, the accuracy of monitoring the process variation can be improved. Further, it is desirable for the gate width of the MOS transistor of the current source I2 to be large for decreasing the variation of the judging reference voltage and the current value Ioff_p' of the current source I2.

Modification Example 2

In the circuit structure shown in FIG. 3, a current source I3 that is constituted with an NMOS transistor is provided instead of the current source (PMOS transistor) I2 of FIG. 2. A drain terminal of the current source (NMOS transistor) I3 is connected to the latch node a1, and a source terminal and a gate terminal are connected to a low-potential side power supply. The judgment target in this case is the PMOS transistor QP1. Other structures are the same as those of the first embodiment (FIG. 1A), so the same reference numerals are applied to the same components and the descriptions thereof are omitted.

According to this structure, the process variation of the PMOS transistor QP1 can be monitored. In addition, the layout size can be reduced since the NMOS transistor is used as the current source I3.

Modification Example 3 of Latch Circuit

In the circuit structure shown in FIG. 4, a current source I4 connected to the latch node a1 is constituted with a PMOS transistor, a drain terminal and a source terminal of the current source (PMOS transistor) I4 are connected to a high-potential side power supply, and a gate terminal is connected to the latch node a1. Other structures are the same as those of the first embodiment (FIG. 1A), so the same reference numerals are applied to the same components and the descriptions thereof are omitted.

The current source I4 utilizes the gate leak current, which is the current source without temperature dependency. According to this structure, it is possible to monitor the temperature variation and the process variation of the NMOS transistor QN1.

Modification Example 4 of Latch Circuit

In the circuit structure shown in FIG. 5, a current source I5 connected to the latch node a1 is constituted with an NMOS transistor, a drain terminal and a source terminal of the current source (NMOS transistor) I5 are connected to a low-potential side power supply, and a gate terminal is connected to the latch node a1. Other structures are the same as those of the first embodiment (FIG. 1A), so the same reference numerals are applied to the same components and the descriptions thereof are omitted.

In this circuit structure, it is possible to monitor the temperature variation and the process variation of the PMOS transistor QP1. Further, the layout size can be reduced since the NMOS transistor is used as the current source I5.

Modification Example 5 of Latch Circuit

Figure 6:
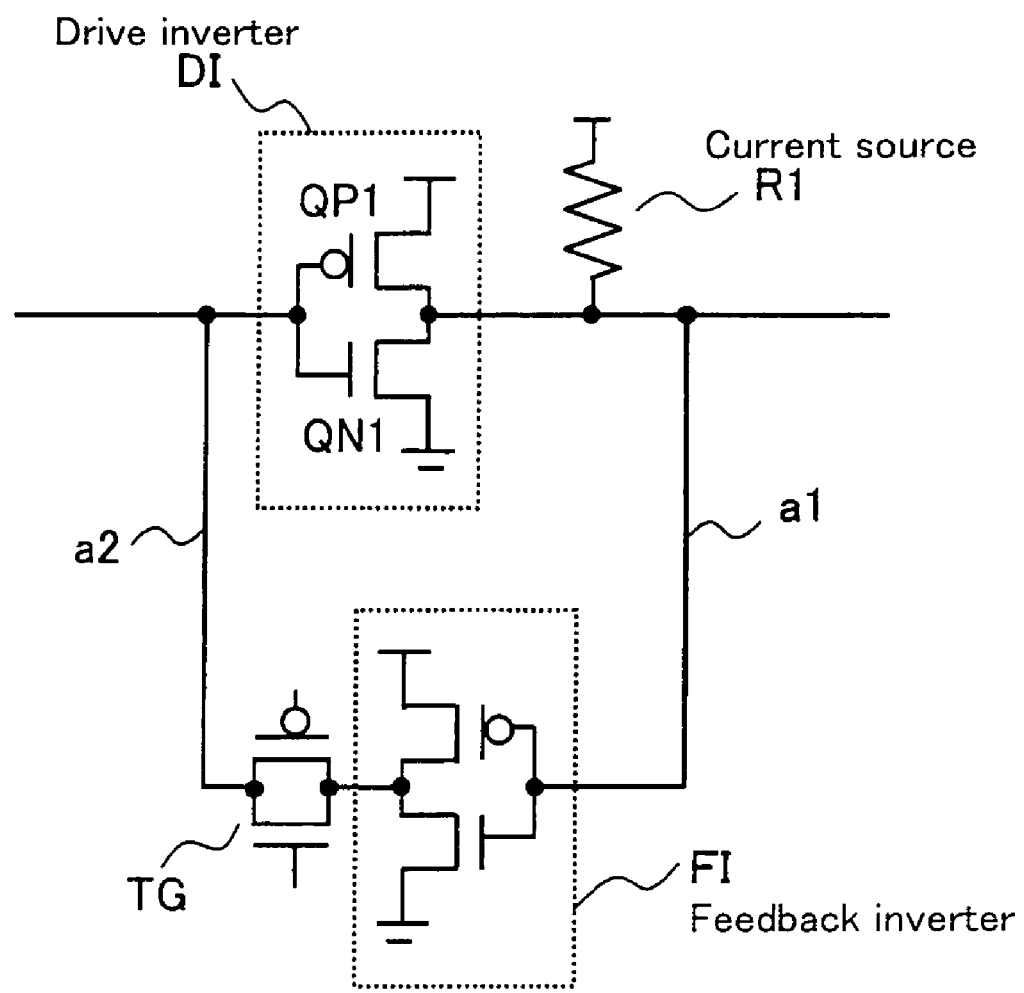
FIG. 6 is a circuit diagram showing the structure of a latch circuit according to Modification Example 5.

In the circuit structure shown in FIG. 6, a current source R1 connected to the latch node a1 is constituted with a resistance element. One end of the resistance element is connected to a high-potential side power supply, and the other end is connected to the latch node a1. Other structures are the same as those of the first embodiment (FIG. 1A), so the same reference numerals are applied to the same components and the descriptions thereof are omitted.

It is possible to monitor the process variation of the NMOS transistor QN1 by comparing the electric current flown in the current source (resistance element) R1 and the ON-current of the NMOS transistor QN1. The resistance value of the current source (resistance element) R1 at this time may be set based on the current value Ion_n(Typical) of the NMOS transistor QN1 to be monitored.

Modification Example 6 of Latch Circuit

In the circuit structure shown in FIG. 7, a current source R2 is constituted with a resistance element that is connected to a low-potential side power supply. Other structures are the same as those of the first embodiment (FIG. 1A), so the same reference numerals are applied to the same components and the descriptions thereof are omitted. It becomes possible to monitor the process variation of the PMOS transistor QP1 by comparing the electric current flown in the current source (resistance element) R2 to the ON-current flown in the PMOS transistor QP1. The resistance value of the current source (resistance element) R2 at this time may be set based on the current value Ion_n(Typical) of the QMOS transistor QP1 to be monitored.

According to the structures shown in FIG. 6 and FIG. 7, layout of the current source becomes simple since the current sources therein are constituted with the resistance element. In the selection of those current sources, the structure of FIG. 6 and the structure of FIG. 7 may be compared so as to select the one that can be designed easily.

Modification Example 7 of Latch Circuit

In the circuit structure shown in FIG. 8, a MOS transistor switch QS is inserted between the current source I1 and the latch node a1. Other structures are the same as those of the first embodiment (FIG. 1A), so the same reference numerals are applied to the same components and the descriptions thereof are omitted.

By controlling the MOS transistor switch QS through a gate terminal G of the MOS transistor switch QS, it is possible to switch the state of the current source I1 to be connected or disconnected to the latch node a1. Herewith, it is possible to switch a operation mode of a normal latch unit and a mode for monitoring the process variation. When the MOS transistor switch QS is set OFF, the electric current from the current source I1 is cut off, so that it does not influence the operation speed of the latch unit. The MOS transistor switch QS can be constituted with a transfer gate TG, a PMOS transistor, or an NMOS transistor. The MOS transistor switch QS constituted with such circuit element may be designed by considering the leak current and the layout size of the switch.

Modification Example 8 of Latch Circuit

In the circuit structure shown in FIG. 9, the number of stages of the vertically stacked PMOS transistors of the drive inverter D1 that constitutes the latch unit is increased to form a PMOS transistor group QQP. In this structure, the characteristic curve of the ON-current Ion_p of the PMOS transistor group QQP is shifted towards the lower side so that the characteristic curve of the ON-current Ion_p and the characteristic current of OFF-current Ioff_n of the NMOS transistor intersect with each other. There is no special current source connected. Other structures are the same as those of the first embodiment (FIG. 1A), so the same reference numerals are applied to the same components and the descriptions thereof are omitted.

In the structure of a normal latch unit, the ON-current Ion_p and the OFF-current Ioff_p of the MOS transistor that constitutes the inverter is designed so that the slope become the same when the signal changes from High to Low and the slope from Low to High. Thus, the characteristic curve of the ON-current Ion_p and the characteristic curve of the OFF-current Ioff_p do not intersect with each other. Even if there is an intersection point, the voltage at the intersection point is very low. Therefore, it is difficult to monitor the process variation based on the magnitude relation of the electric current as described above.

Now, a monitoring method of the process variation will be described in the circuit structure shown in FIG. 9. FIG. 9B shows the characteristic of the ON-current Ion_p of the PMOS transistor group QQP with a vertically stacked structure and the characteristic of the OFF-current Ioff_n of the NMOS transistor QN1. The voltage at the intersection point of the characteristic curve (Typical at the time of design) of the ON-current, Ion_p, and the characteristic curve (Typical at the time of design) of the OFF-current, Ioff_n, is assumed to be V0. For example, in the case where the PMOS transistor is fabricated as "Fast" and the NMOS transistor as "Slow", the latch node a1 inverts from Low to High. By using this phenomenon, the process variations of "Fast"/"Slow", "Slow"/"Fast" (NMOS transistor/PMOS transistor) can be monitored from the data latched in the latch unit. This process variation information can be utilized as the information for analyzing the noise margin of the memory cell.

Figure 9A:
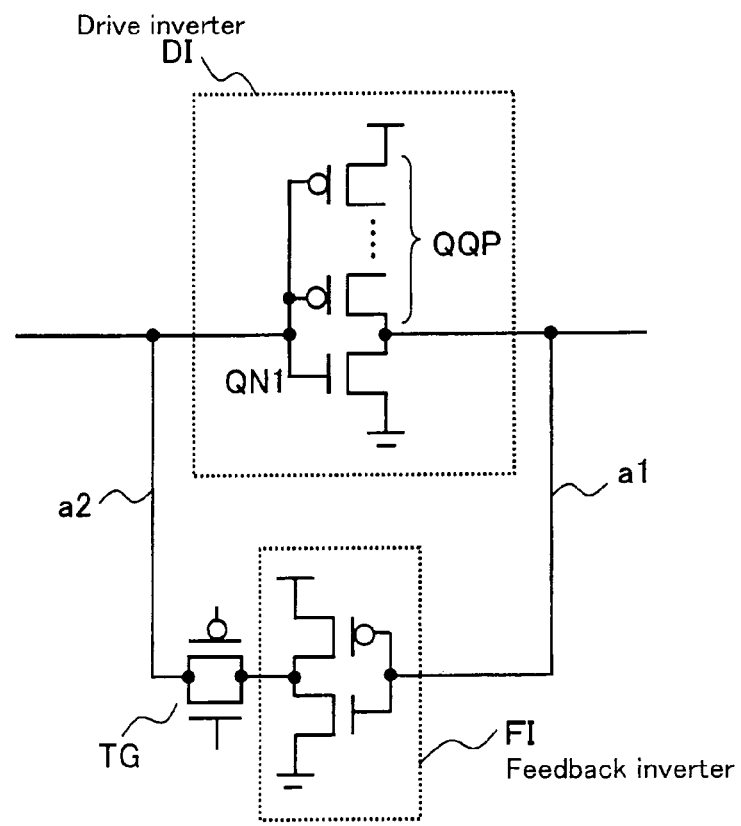
FIG. 9A is a circuit diagram showing the structure of a latch circuit according to Modification Example 8.
Figure 9B:
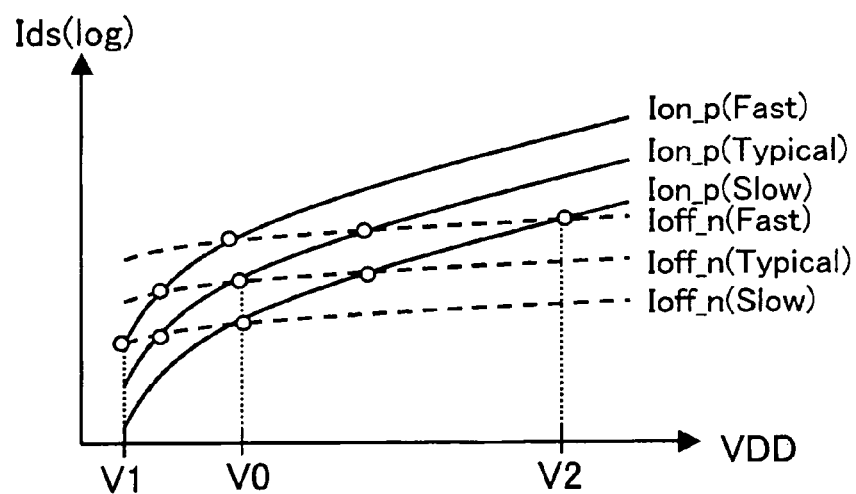
FIG. 9B is a characteristic diagram showing dependency to supply voltage of the electric current of a drive inverter.

FIG. 9A shows the circuit structure that comprises the drive inverter DI. However, Modification Example 8 can be performed as well in the same manner with respect to the circuit structure that comprises the feedback inverter FI. Further, the vertically stacked structure of the PMOS transistors can be replaced with the vertically stacked structure of the NMOS transistors.

Modification Example 9 of Latch Circuit

Figure 10A:
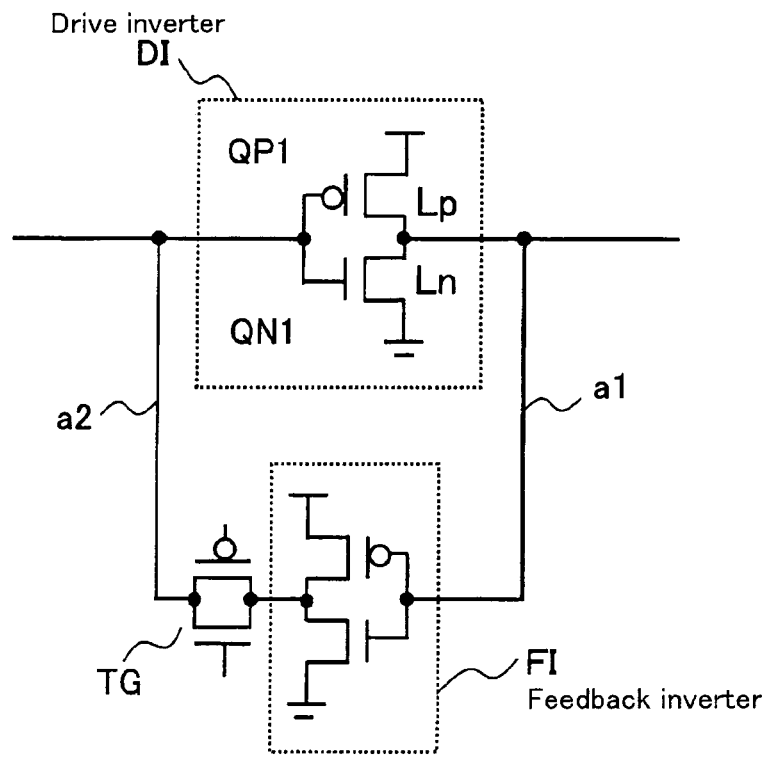
FIG. 10A is a circuit diagram showing the structure of a latch circuit according to Modification Example 9.

In the circuit structure shown in FIG. 10A, gate length Lp of the PMOS transistor and gate length Ln of the NMOS transistor QN1 constituting the drive inverter DI are set to be in different lengths. For example, by setting the gate length Lp of the PMOS transistor to be longer, the characteristic curve of the ON-current Ion_p(typical) of the PMOS transistor QP1 and the characteristic curve of the OFF-current, Ioff_n(Typical), of the NMOS transistor QN1 intersect with each other. There is no special current source connected even in this case. Other structures are the same as those of the first embodiment shown in FIG. 1, so the same reference numerals are applied to the same components and the descriptions thereof are omitted.

Figure 10B:
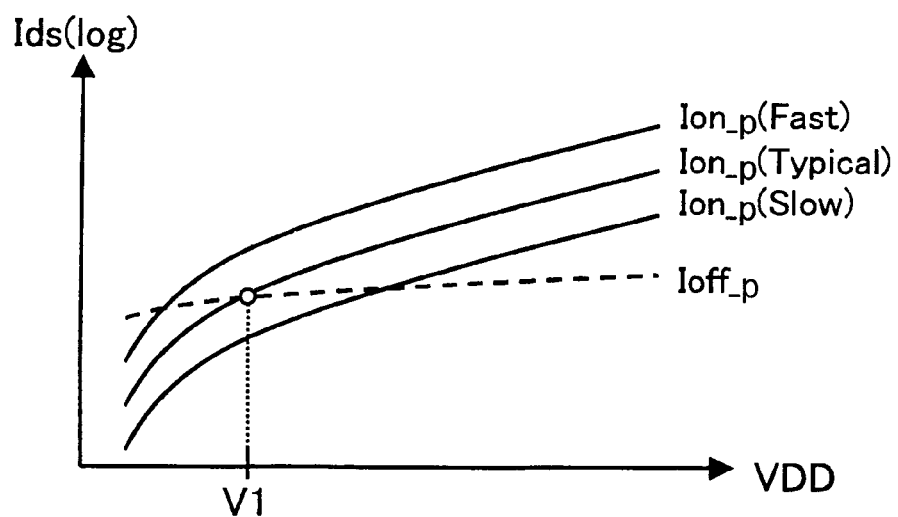
FIG. 10B is a characteristic diagram showing dependency to supply voltage of the electric current of a drive inverter.

As in the measurement method described above, judgment is carried out based on the judging reference voltage V1 at the intersection point of the characteristic curve of the ON-current Ion_p(typical) and the characteristic curve of the OFF-current Ioff_n, and the process variation is measured from the binary signal that is latched in the latch unit at that time. In this circuit structure, it is possible to reduce the variations in the ON-current of the PMOS transistor by extending the gate length of the PMOS transistor QP1. Herewith, the process variation of the NMOS transistor QN1 can be monitored. FIG. 10 shows the circuit structure that comprises the drive inverter DI. However, Modification Example 9 can also be performed in the same manner with respect to the circuit structure that comprises the feedback inverter FI.

(Overall Structure 1 of Process Monitor Circuit)

Figure 11:
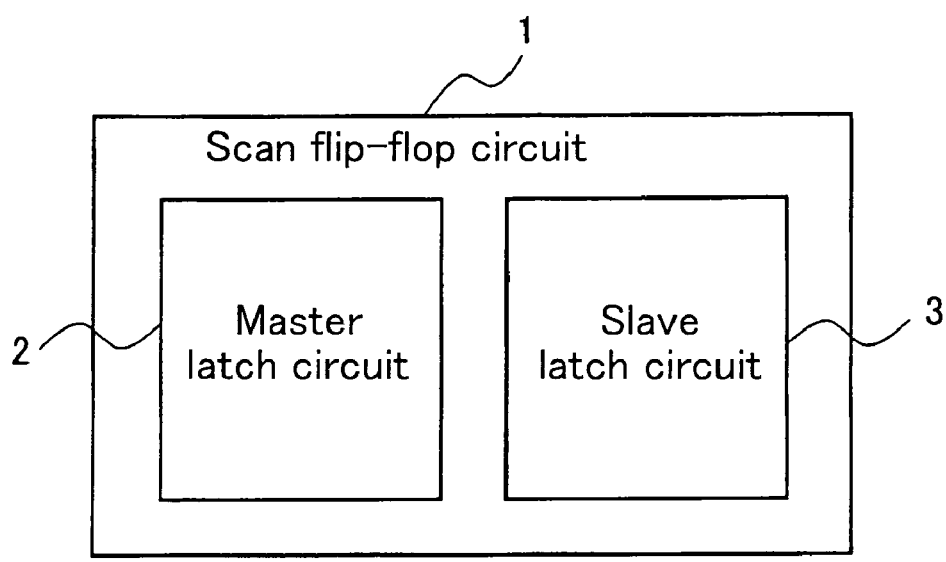
FIG. 11 is a first block diagram showing a constitution of a scan flip-flop circuit according to the embodiments of the present invention.

Generally, in a semiconductor chip, a plurality of scan flip-flop circuits is connected in a chain form to constitute a scan chain. FIG. 11 shows a single scan flip-flop circuit 1 within the scan chain. The scan flip-flop circuit 1 comprises a master latch circuit 2 and a slave latch circuit 3. Either or both of the master latch circuit 2 and the slave latch circuit 3 is constituted with one of the latch circuits described referring to FIG. 1-FIG. 10.

According to this structure, information on the process variation within the chip can be collected efficiently by utilizing the scan chain. The information on the process varia-tion of latch circuit may be outputted to the feedback circuit within the chip or may be outputted to the outside the semiconductor chip.

The voltage may be boosted up at the time of scan shift operation of the scan chain. However, data inversion due to the boost-up of the voltage does not occur, and any trouble is not generated.

Figure 12:
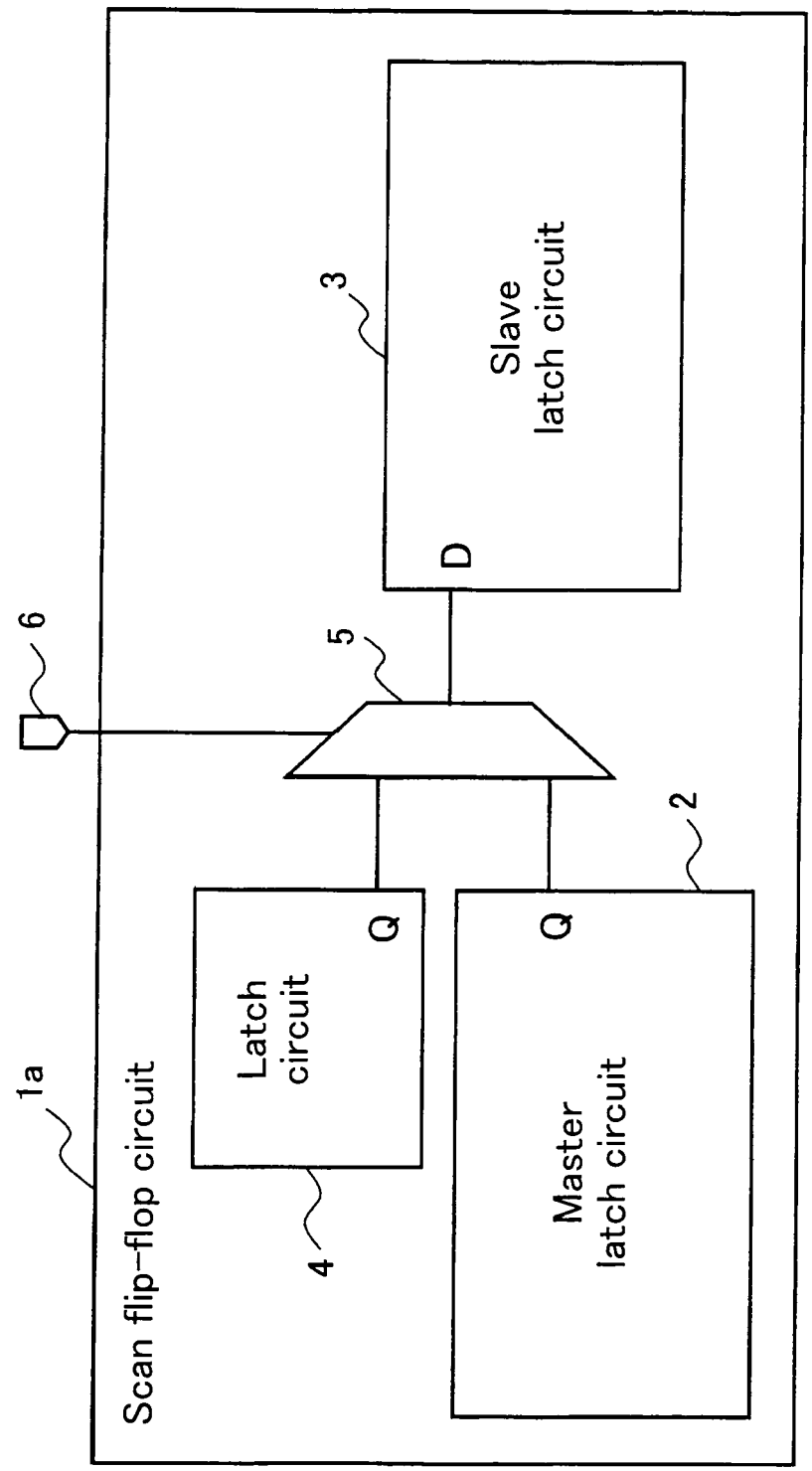
FIG. 12 is a second block diagram showing a constitution of the scan flip-flop circuit according to the embodiments of the present invention.

Overall Structure 2 of Process Monitor Circuit) A scan flip-flop circuit 1a shown in FIG. 12 comprises a master latch circuit 2, a slave latch circuit 3, a latch circuit 4, and a multiplexer circuit 5. The multiplexer circuit 5 selects the output of the master latch circuit 2 and the latch circuit 4 based on a control signal 6, and outputs the selected one to the slave latch circuit 3. The latch circuit 4 is constituted with one of the latch circuits that are described referring to FIG. 1-FIG. 10.

When the multiplexer circuit 5 selects the master latch circuit 2, a normal scan shift operation of the scan flip-flop circuit 1a is carried out. In addition, when the multiplexer circuit 5 selects the latch circuit 4, the information on the process variation latched in the latch circuit 4 can be obtained.

(Overall Structure 3 of Process Monitor Circuit)

Figure 13:
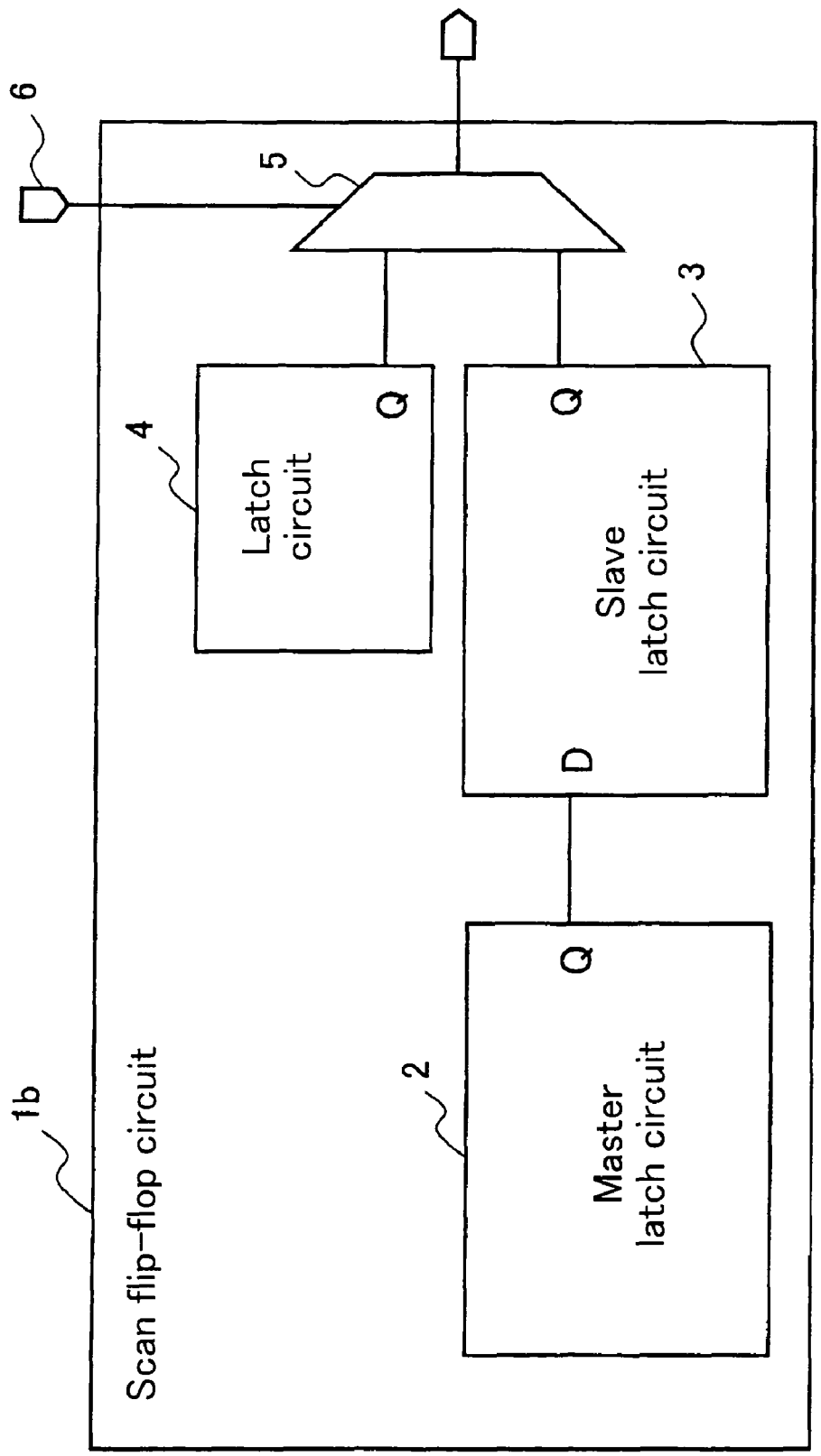
FIG. 13 is a third block diagram showing a constitution of the scan flip-flop circuit according to the embodiments of the present invention.

A scan flip-flop circuit 1b shown in FIG. 13 comprises a master latch circuit 2, a slave latch circuit 3, a latch circuit 4, and a multiplexer circuit 5. The master latch circuit 2 and the slave latch circuit 3 are connected in series. The multiplexer circuit 5 selects the output of the slave latch circuit 3 and the latch circuit 4 based on the control signal 6, and outputs the selected one to the outside. The latch circuit 4 is constituted with one of the latch circuits that are described referring to FIG. 1-FIG. 10.

According to the structure shown in FIG. 12 or the structure shown in FIG. 13, the scan flip-flop circuit 1b can be designed with an existing layout method of the scan chain circuit because the latch circuit 4 is provided in the cell of the scan flip-flop circuit 1a. Further, since the latch circuit 4 is isolated, the influence to the speed of the scan shift operation can be suppressed at the time of the scan shift. In the actual structure, either the structure of FIG. 12 or that of FIG. 13 is selected by considering the influence to the layout size and the operation speed.

(Overall Structure 4 of Process Monitor Circuit)

Figure 14:
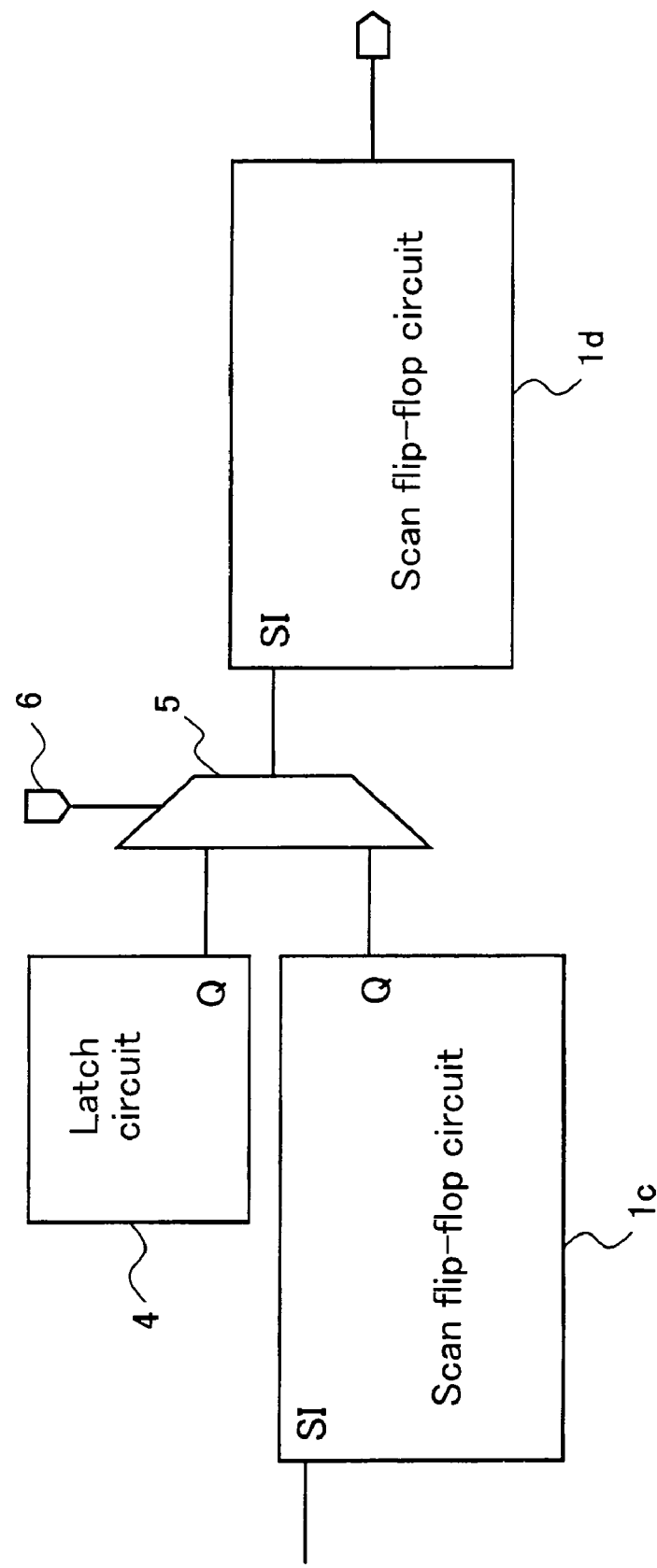
FIG. 14 is a fourth block diagram showing a constitution of the scan flip-flop circuit according to the embodiments of the present invention.

In the structure shown in FIG. 14, the multiplexer circuit 5 selects the output of a scan flip-flop circuit 1c and the latch circuit 4 based on the control signal 6, and outputs the selected one to a scan flip-flop circuit 1d in the next stage. According to this structure, it is not necessary to design an additional cell as the scan flip-flop circuit, and the latch circuit 4 for monitoring the process variation can be arranged freely. The structures shown in FIG. 11-FIG. 14 can be applied to a large number of similar scan flip-flop circuits that are not shown in the drawings.

(Process Variation Judging Method 1)

Figures 15A, 15B:
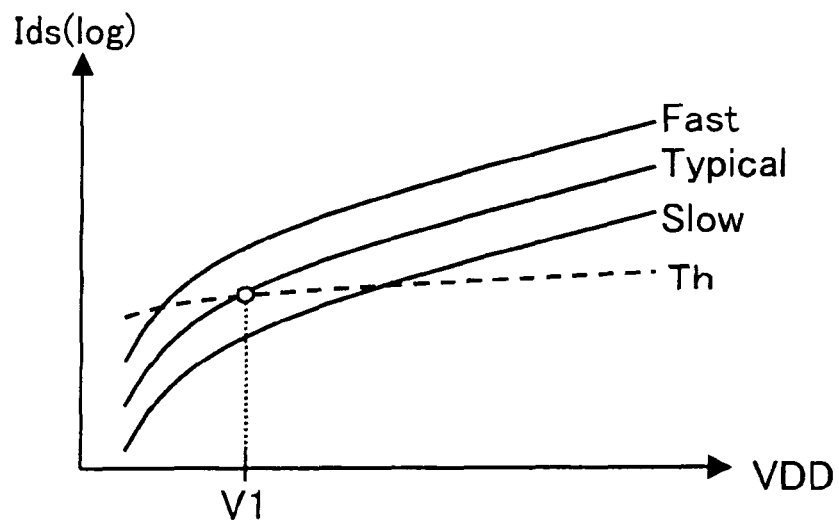
FIG. 15A is a first characteristic diagram showing dependency to supply voltage of the electric current of a drive inverter in a process variation judging method according to the embodiments of the present invention.
FIG. 15B is a first table showing distribution of data value inversions.

FIG. 15A and FIG. 15B show a process variation judging method. This can be applied to the latch circuits 4 shown in FIG. 1-FIG. 10. Based on assumption that the voltage at the intersection point of the current characteristic curve of the design value (Typical) and the characteristic curve of the reference current Th is considered as the reference judging voltage V1, the process variation is judged by measuring and totalizing the inversions of the binary signals latched in the latch circuit 4 at the judging reference voltage V1, which are generated in accordance with the magnitude relation of the current flown in the latch node.

For example, presence or absence of inversions in ten thousand latch circuits 4 is counted at the judging reference voltage V1. By applying the counted inversion number to the table of FIG. 15, the overall process variations of the area where the latch circuits 4 are located can be judged. When the data of nine thousand latch circuits 4 is inverted under this condition, it is judged that the process is produced in "Slow". Further, as the location of the data inversion can be judged, the variation within the chip can be checked as well.

In this method of measurement, counting is performed at a single supply voltage. Therefore, the measurement time may be controlled in such a manner that the scan shift operation and power supply satisfy the single voltage condition mentioned above. Thus, it requires almost no cost for the measurement.

(Process Variation Judging Method 2)

Figures 16A, 16B:
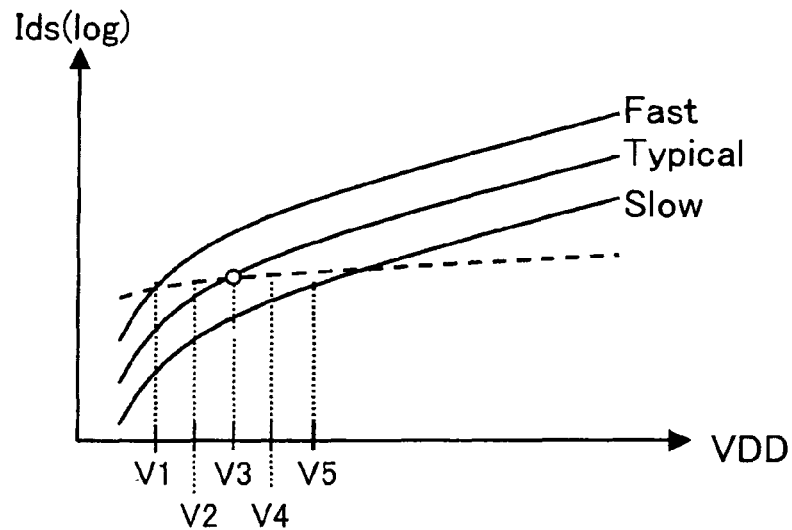
FIG. 16A is a second characteristic diagram showing dependency to supply voltage of the electric current of a drive inverter in a process variation judging method according to the embodiments of the present invention.
FIG. 16B is a second table showing distribution of data value inversions.

FIG. 16A and FIG. 16B shows an example of measurement under a plurality of voltage conditions. By carrying out the measurement with the plurality of voltage conditions, the extent of the process variation can be judged more specifically. The more the number of supply voltage conditions increases, the better the accuracy of process variation can be judged. For example, as shown in FIG. 16A, when measurement is carried out with the voltage conditions of V1-V5, the finished state of the process can be judged from the data state at each voltage. FIG. 16B shows the results of measurement done with the voltage conditions of V1-V5. There is an inversion (upset) at the judging reference voltage V1 in the result of measurement shown in FIG. 16B, and so it can be judged that one of the latch circuits is fabricated as "Fast 2". According to the method of measurement under the plurality of voltage conditions, it is possible to judge the process variations of the latch circuits one by one.

(Overall Structure 1 of Semiconductor Integrated Circuit Device)

In a semiconductor chip shown in FIG. 17, reference numeral 11 is a semiconductor chip. 12 is a circuit block in which a latch circuit is included. 13 is one of the scan chain circuits shown in FIG. 11-FIG. 14. 14 is a process characteristic judging circuit which judges the process variation from the result of monitoring the process variation, and gives an instruction to a feedback circuit 15. 15 is the feedback circuit which has a function of improving the device characteristic of the circuit block 12 in accordance with the contents of the instruction from the process characteristic judging circuit 14.

By providing such block structure, it is possible to reduce deterioration in the yield caused by the influence of the process variation, by a function of improving the device characteristic that the feedback circuit 15 has. The details of the feedback circuit 15 will be described later referring to FIG. 22 and FIG. 23.

(Overall Structure 2 of Semiconductor Integrated Circuit Device)

Figure 18:
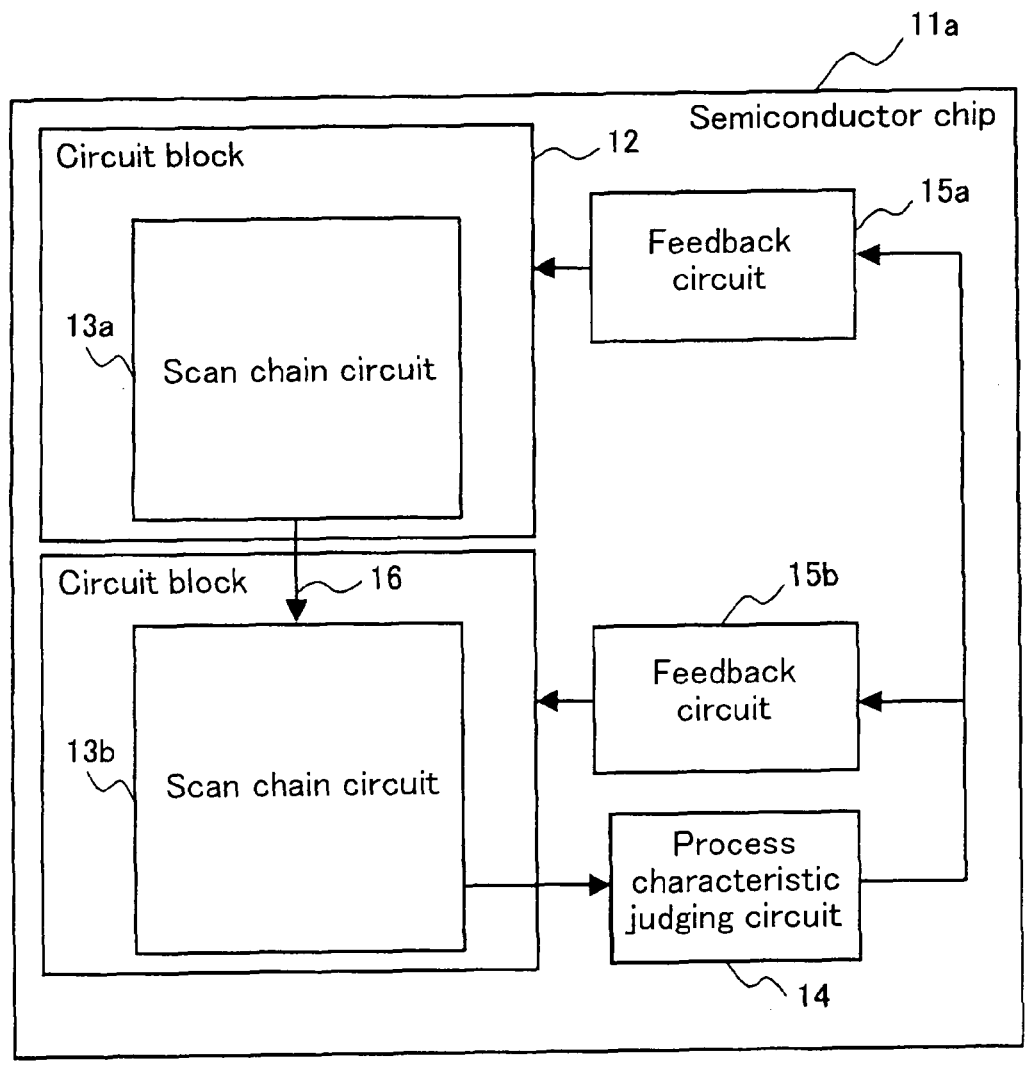
FIG. 18 is a second constitution diagram of the semiconductor chip according to the embodiments of the present invention.

The semiconductor chip shown in FIG. 18 is provided with a plurality of scan chain circuits 13a and 13b, that consist of one of the structures shown in FIG. 11-FIG. 14. The scan chain circuits 13a and 13B are connected to each other through a wiring 16. According to this structure, the wiring resource from the process monitor circuit to the process characteristic judging circuit 14 is reduced, and thereby it enables reduction in the number of process characteristic judging circuits.

(Overall Structure 3 of Semiconductor Integrated Circuit Device)

Figure 19:
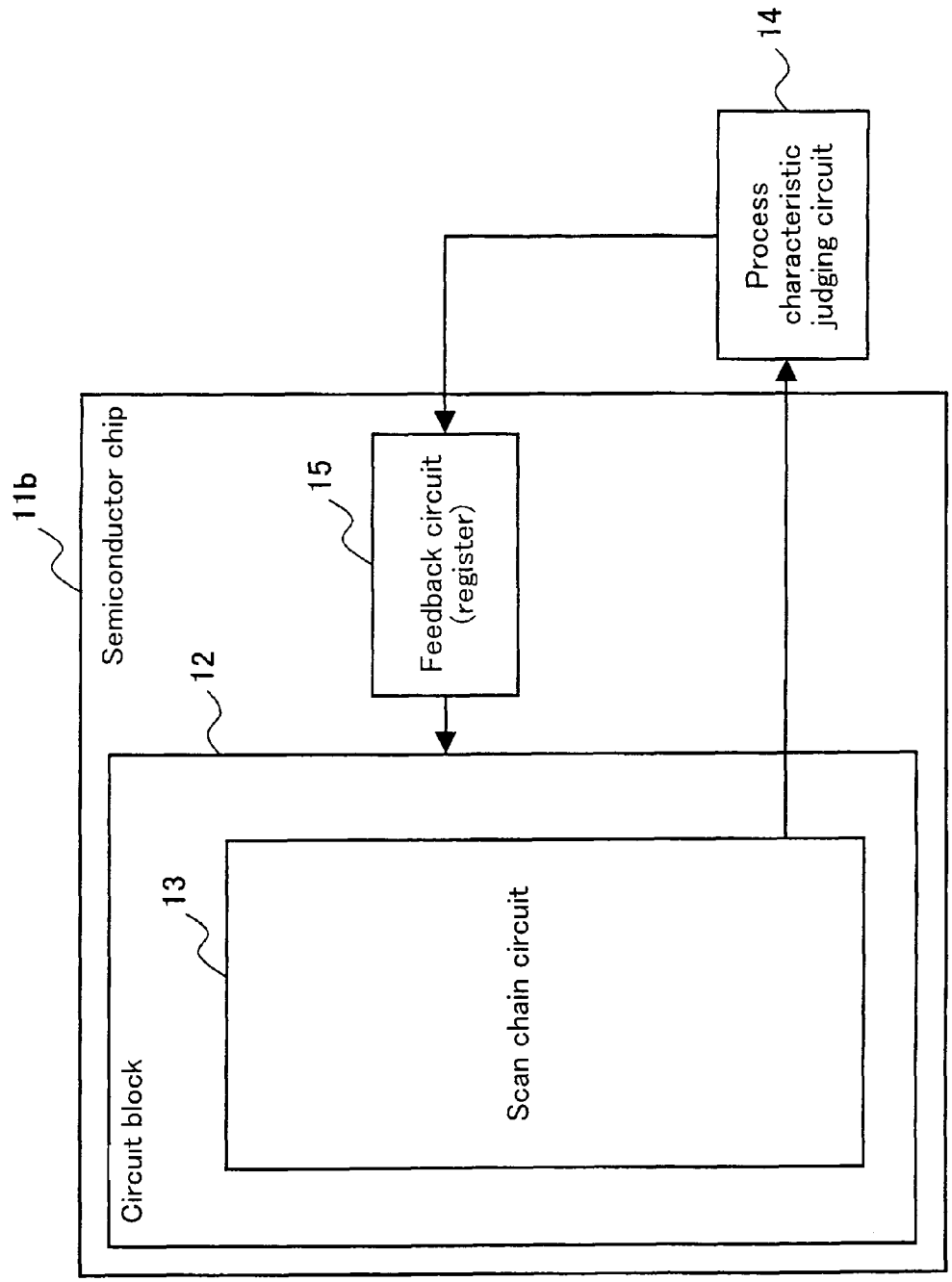
FIG. 19 is a third constitution diagram of the semiconductor chip according to the embodiments of the present invention.

In the circuit structure shown in FIG. 19, the process characteristic judging circuit 14 is arranged outside a semiconductor chip 11b. The process characteristic judging circuit 14 operates at the time of the operation test of the semiconductor chip 11b and gives an instruction to the feedback circuit 15 based on the result of measurement. The instruction result is recorded to a register of the feedback circuit 15. Further, the process characteristic judging circuit 14 is fabricated in a semiconductor chip that is different from the semiconductor chip having the latch circuit for monitoring the process variation, and it can be connected on the manufactured products.

The operating condition of the feedback circuit 15 is not determined at the time of the test. The process variation may be monitored by every certain time, and operating condition of the feedback circuit 15 may also be determined based on the results thereof.

(Overall Structure 4 of Semiconductor Integrated Circuit Device)

Figure 20:
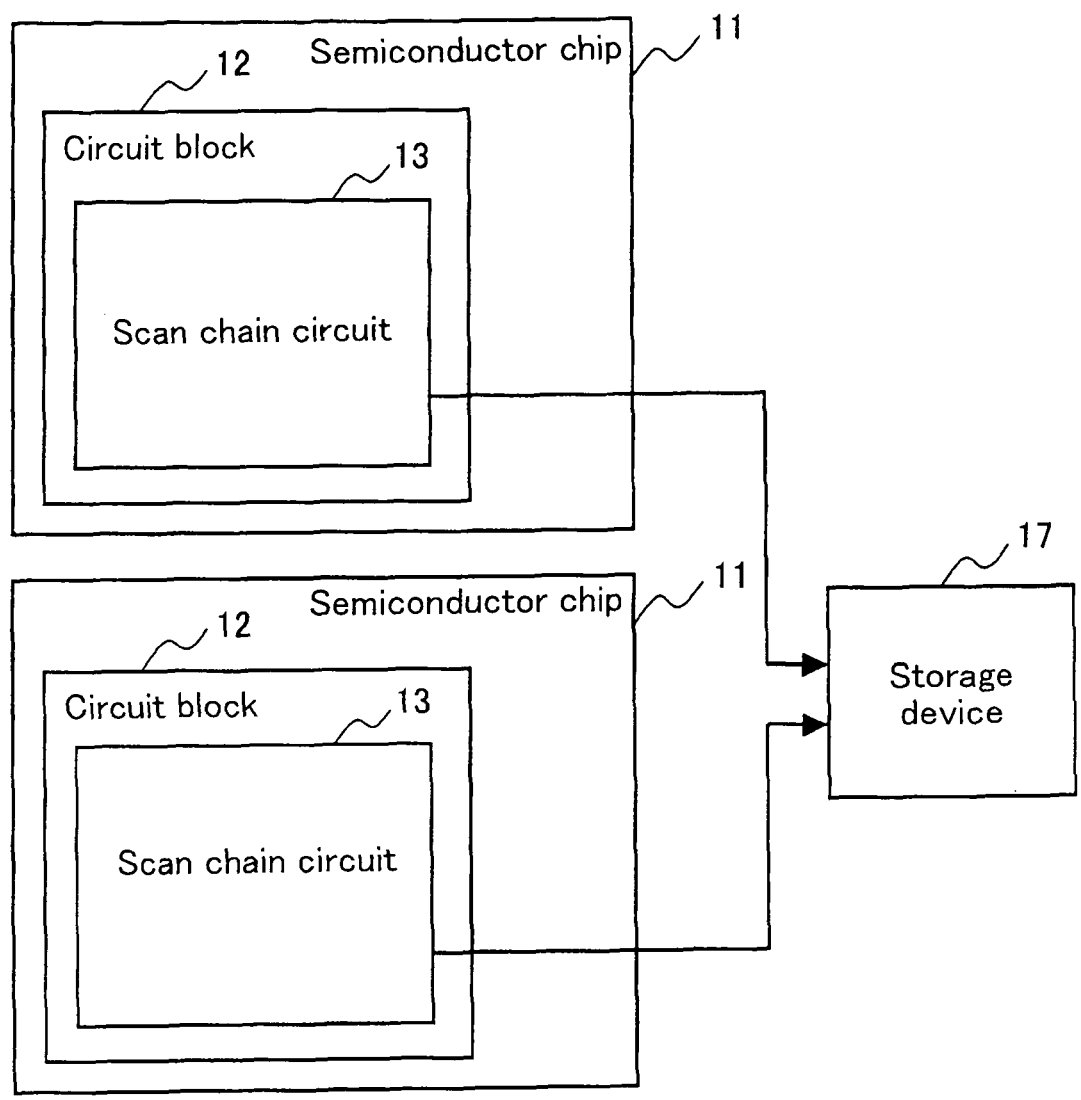
FIG. 20 is a fourth constitution diagram of the semiconductor chip according to the embodiments of the present invention.

In the circuit structure shown in FIG. 20, a storage device 17, which corresponds to a plurality of semiconductor chips 11 to which the scan chain circuits 13 shown in one of the drawings FIG. 11-FIG. 14 are mounted, is arranged outside those semiconductor chips. The binary data outputted from each of semiconductor chips 11 is stored in the storage device 17. By this structure, it is possible to utilize the data stored in the storage device 17 for controlling the device manufacturing steps in the same way of use as that of PCM (Process Control Monitor).

Further, since the conventional characteristic evaluation element is formed on the scribe lanes, evaluation measurement cannot be achieved after the dicing step. However, in the structure shown in FIG. 20, measurement can be achieved in the individual semiconductor chips even after being assembled. For example, the circuit structure shown in FIG. 20 can be used for analyzing the change in the device characteristic due to the stress after the assembling. Furthermore, information on the process variation serves as the characteristic information of the individual semiconductor chips. Thus, mistake such as mix-up of the semiconductor chips can be prevented through using such information for the step control.

(Overall Structure 5 of Semiconductor Integrated Circuit Device)

In the circuit structure shown in FIG. 21, a plurality of blocks 12 shown in FIG. 17 are mounted within a single semiconductor chip 11. There are such cases that, when the channel implantation concentration, the process conditions of an oxide film and the like are different, for example, the process variation tendencies between the circuit blocks become independent and have no correlation with each other. Even in such cases, the feedback circuits 15 provided to each of the circuit blocks carries out the suitable operation for each circuit block. Thus, the device characteristic can be improved. Such structure is not limited to the circuit structure of FIG. 17, but may be applied to the circuit structures shown in FIG. 18 and FIG. 19 as well.

(Overall Structure 6 of Semiconductor Integrated Circuit Device)

Figure 22:
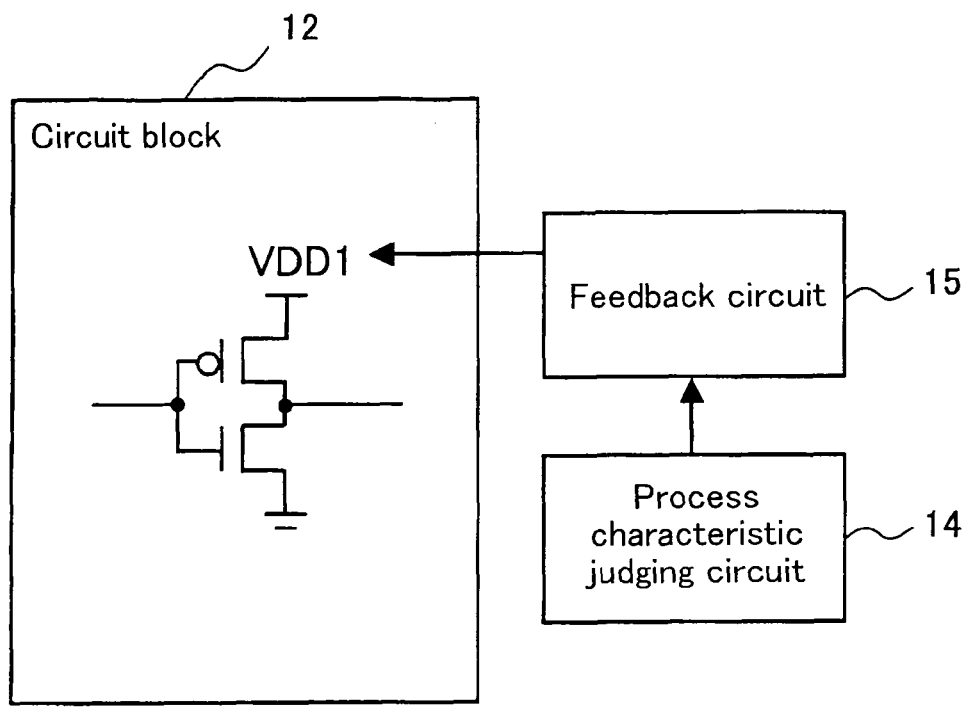
FIG. 22 is a first constitution diagram of a feedback system according to the embodiments of the present invention.

In the circuit structure shown in FIG. 22, the feedback circuit 15 adjusts the voltage of the circuit block 12 in accordance with an instruction from the process characteristic judging circuit 14 so as to improve the characteristic of the transistor. For example, in the case where the current capacity of the MOS transistor that constitutes the circuit block 12 is fabricated small, the feedback circuit 15 boosts up the supply voltage to VDD1 in accordance with the process information and thereby the current capacity of the MOS transistor can be brought up to the design value (Typical).

(Overall Structure 7 of Semiconductor Integrated Circuit Device)

Figure 23:
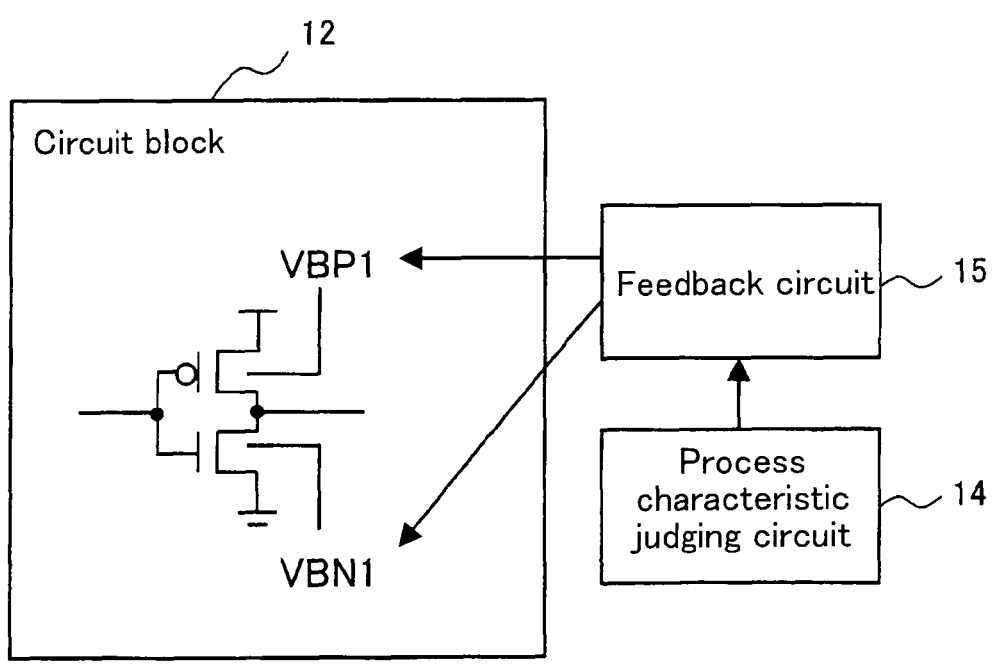
FIG. 23 is a second constitution diagram of a feedback system according to the embodiments of the present invention.

The circuit structure shown in FIG. 23 improves the characteristic of the MOS transistor by controlling the substrate bias. For example, in the case where the MOS transistor that constitutes the circuit block is fabricated as "Slow", the feedback circuit 15 sets the substrate bias to the forward body bias in accordance with the process information and thereby the current capacity of the MOS transistor can be brought up to the design value (Typical).

The latch circuit of the present invention that is capable of monitoring the process variation can monitor the NMOS transistor and the PMOS transistor separately. Therefore, with respect to the control of the substrate bias, it is also possible to control substrate bias VBN1 of the NMOS transistor and substrate bias VBP1 of the PMOS transistor separately from each other.

The present invention has been described in detail referring to the most preferred embodiments. However, various combinations and modifications of the components are possible without departing from the spirit and the broad scope of the appended claims.

What is claimed is:

1. A latch circuit, comprising:
   a latch unit wherein a drive inverter and a feedback inverter are connected in a cyclic form, at least one of which comprises a MOS transistor;
   a current source with no input control signal connected to at least one of latch nodes of said latch unit, and
   a MOS transistor switch provided between said current source and said latch node,
   wherein a drain terminal of said MOS transistor switch is connected to said latch node,
   a source terminal of said MOS transistor switch is connected to said current source, and
   said drain terminal of said MOS transistor switch is a different terminal from said source terminal of said MOS transistor switch.

2. The latch circuit according to claim 1, wherein said current source comprises a PMOS transistor, a drain terminal of said PMOS transistor is connected to said latch node, a source terminal of said PMOS transistor is connected to a high-potential side power supply and a gate terminal of said PMOS transistor is connected to said source terminal.

3. The latch circuit according to claim 1, further comprising a low-potential side power supply, wherein
   said current source comprises an NMOS transistor, a drain terminal of said NMOS transistor is connected to said latch node, a source terminal of said NMOS transistor is connected to said low-potential side power supply and a gate terminal of said NMOS transistor is connected to said source terminal.

4. The latch circuit according to claim 1, further comprising a high-potential side power supply, wherein
   said current source comprises a PMOS transistor, a drain terminal and a source terminal of said PMOS transistor are connected to said high-potential side power supply, and a gate terminal of said PMOS transistor is connected to said latch node.

5. The latch circuit according to claim 1, further comprising a low-potential side power supply, wherein
   said current source comprises an NMOS transistor, a drain terminal and a source terminal of said NMOS transistor are connected to said low-potential side power supply, and a gate terminal of said NMOS transistor is connected to said latch node.

6. The latch circuit according to claim 1, further comprising a high-potential side power supply, wherein
   said current source comprises a resistance element, wherein
   one end of said resistance element is connected to said high-potential side power supply, and the other end of said resistance element is connected to said latch node.

7. The latch circuit according to claim 1, further comprising a low-potential side power supply, wherein
   said current source comprises a resistance element, wherein
   one end of said resistance element is connected to said low-potential side power supply, and the other end of said resistance element is connected to said latch node.

8. The latch circuit according to claim 1, wherein a magnitude relation of electric current flown in said MOS transistor and electric current flown in said current source is judged based on presence or absence of inversions in data values latched in said latch node.

9. The latch circuit according to claim 8, wherein a gate terminal of said MOS transistor switch is a controllable terminal.

* * * * *